(12) United States Patent
Hatano et al.

(10) Patent No.: US 12,298,083 B2
(45) Date of Patent: May 13, 2025

(54) TEMPERATURE CONTROL UNIT AND TEMPERATURE CONTROL DEVICE

(71) Applicant: TOMOEGAWA CORPORATION, Tokyo (JP)

(72) Inventors: Shuhei Hatano, Shizuoka (JP); Hideki Moriuchi, Shizuoka (JP); Katsuya Okumura, Tokyo (JP)

(73) Assignee: TOMOEGAWA CORPORATION, Tokyo (JP)

( * ) Notice: Subject to any disclaimer, the term of this patent is extended or adjusted under 35 U.S.C. 154(b) by 763 days.

(21) Appl. No.: 17/311,722

(22) PCT Filed: Dec. 9, 2019

(86) PCT No.: PCT/JP2019/048007
§ 371 (c)(1),
(2) Date: Jun. 8, 2021

(87) PCT Pub. No.: WO2020/137473
PCT Pub. Date: Jul. 2, 2020

(65) Prior Publication Data
US 2022/0026162 A1    Jan. 27, 2022

(30) Foreign Application Priority Data

Dec. 26, 2018 (JP) ................................ 2018-242667

(51) Int. Cl.
*F28D 15/04* (2006.01)
*C09K 5/04* (2006.01)
(Continued)

(52) U.S. Cl.
CPC ............ *F28D 15/046* (2013.01); *C09K 5/045* (2013.01); *F28D 15/0233* (2013.01); *F28F 21/085* (2013.01); *F28D 2021/0028* (2013.01)

(58) Field of Classification Search
CPC ............... F28D 15/046; F28D 15/0233; F28D 2021/0028; C09K 5/045; F28F 21/085
See application file for complete search history.

(56) References Cited

U.S. PATENT DOCUMENTS

2006/0048919 A1*  3/2006  Hsu .................... F28D 15/0233
                                                165/104.26
2009/0020267 A1*  1/2009  Fukushima .............. C09K 5/10
                                                165/104.21
(Continued)

FOREIGN PATENT DOCUMENTS

CN        1432782 A       7/2003
CN      201402416 Y       2/2010
(Continued)

OTHER PUBLICATIONS

Japanese Patent Office, Office Action issued in JP App. No. 2020-563023 dated Nov. 14, 2023 (with English Translation), 13 pages.
(Continued)

*Primary Examiner* — Tho V Duong
(74) *Attorney, Agent, or Firm* — Wood Herron & Evans LLP

(57) ABSTRACT

The present invention provides a temperature control unit capable of efficiently controlling a temperature of a specific object with reduced risk of failure of electronic components due to leakage of a temperature control medium. The temperature control unit (1), which controls a temperature of a specific object, contains a temperature control medium, and a metal fiber sheet (50) that is formed with a space serving as a channel of the temperature control medium. The latent heat of evaporation of the temperature control medium is within the range of from 70 to 200 kJ/kg when the temperature control medium changes the state from a liquid state to a gaseous state. The volume expansion rate of the temperature control medium is at most 250 times when the
(Continued)

temperature control medium changes the state from a liquid state to a gaseous state under atmospheric pressure.

14 Claims, 22 Drawing Sheets

(51) Int. Cl.
*F28D 15/02* (2006.01)
*F28F 21/08* (2006.01)
*F28D 21/00* (2006.01)

(56) References Cited

U.S. PATENT DOCUMENTS

| | | | |
|---|---|---|---|
| 2011/0254147 A1 | 10/2011 | Otsuka et al. | |
| 2013/0223010 A1* | 8/2013 | Shioga | H01L 23/34 438/122 |
| 2014/0360701 A1* | 12/2014 | Aoki | F28D 15/04 165/104.21 |
| 2016/0054073 A1* | 2/2016 | Rice | F28D 15/043 165/104.24 |
| 2016/0197245 A1 | 7/2016 | Park et al. | |
| 2016/0295742 A1 | 10/2016 | Moghaddam et al. | |

FOREIGN PATENT DOCUMENTS

| | | |
|---|---|---|
| CN | 102884620 A | 1/2013 |
| JP | H06055819 U | 8/1994 |
| JP | H07335797 A | 12/1995 |
| JP | H10103884 A | 4/1998 |
| JP | H10316596 A | 12/1998 |
| JP | 2003042675 A | 2/2003 |
| JP | 2007024369 A | 2/2007 |
| JP | 2008045820 A | 2/2008 |
| JP | 2009063191 A | 3/2009 |
| JP | 2009250810 A | 10/2009 |
| JP | 2010243050 A | 10/2010 |
| JP | 2011127780 A | 6/2011 |
| JP | 2011519013 A | 6/2011 |
| JP | 2015197245 A | 11/2015 |
| JP | 2016069632 A | 5/2016 |
| JP | 2018186272 A | 11/2018 |
| KR | 20180095158 A | 8/2018 |
| TW | 200909758 A | 3/2009 |
| TW | 201611982 A | 4/2016 |
| WO | 2018003957 A1 | 1/2018 |

OTHER PUBLICATIONS

European Patent Office, Search Report issued in EP 19903706.0 dated Aug. 1, 2022.
Taiwan Patent Office, Office Action issued in TW 108144836 dated Jan. 18, 2023.
Korean Patent Office, Office Action issued in KR 10-2023-7043919 dated Jan. 30, 2024 (with English Translation) 11 pages.
PCT Office, International Search Report issued in PCT/JP2019/048007 mailed on Feb. 4, 2020.
Chinese Patent Office, Office Action issued in CN 201980086101.6 dated Jul. 20, 2022.
Korean Patent Office, Office Action issued in KR 10-2021-7019454 dated Nov. 14, 2022. .
Japanese Patent Office, Office Action issued in JP 2020-563023 dated Mar. 19, 2024.

* cited by examiner

TEMPERATURE CONTROL UNIT AND TEMPERATURE CONTROL DEVICE

TECHNICAL FIELD

The present invention relates to a temperature control unit and a temperature control device.

Priority is claimed on Japanese Patent Application No. 2018-242667, filed on Dec. 26, 2018, in Japan, the content of which is incorporated herein by reference.

BACKGROUND ART

In electrical equipment, electronic equipment, semiconductor equipment, and the like, a technique for controlling and adjusting the temperature of a circuit or the like is known. For example, Patent Document 1 describes a cooling device for semiconductor devices such as ICs and LSIs. The cooling device described in Patent Document 1 has a support base and a plurality of protruded heat-radiating portions, and a cotton-like body, in which a volatile liquid is impregnated in a hollow portion formed inside each of the support base and the protruded heat-radiating portion, is provided. The cooling device described in Patent Document 1 cools a semiconductor device by utilizing the heat of vaporization of a volatile liquid which is a temperature control medium.

PRIOR ART LITERATURE

Patent Documents

[Patent Document 1] Japanese Unexamined Patent Application, First Publication No. H07-335797

SUMMARY OF INVENTION

Technical Problem

However, in the examples described in Patent Document 1, an alcohol is used as the volatile liquid. An alcohol has a relatively large coefficient of volume expansion when it is vaporized from a liquid to a gas. Therefore, in the cooling device described in Patent Document 1, the alcohol rapidly expands in the hollow portion when the alcohol evaporates, and the gaseous alcohol escapes from the inside of the hollow portion to the outside. For this reason, the alcohol condenses outside the hollow portion, and the alcohol again becomes a liquid, and then may leak.

As described above, when the cooling device described in Patent Document 1 is used, the liquid alcohol leaked to the outside of the hollow portion may cause a failure of surrounding electronic equipment.

In addition, when adjusting the temperature of a semiconductor device or the like, it is required to efficiently adjust the temperature of the object.

The present invention provides a temperature control unit capable of efficiently controlling the temperature of an object by reducing the risk of failure of electronic components caused by leakage of a temperature control medium.

Solution to Problem

The present invention has the following aspects.

[1] A temperature control unit, which controls a temperature of an object, containing a temperature control medium, and a metal body in which a space serving as a channel of the aforementioned temperature control medium is formed, wherein the aforementioned temperature control medium has a latent heat of evaporation of the aforementioned temperature control medium within a range of from 70 to 200 (70~200) kJ/kg when the aforementioned temperature control medium changes a state thereof from a liquid to a gas, and the aforementioned temperature control medium has a coefficient of volume expansion which is at most 250 times when the aforementioned temperature control medium changes a state thereof from a liquid to a gas under atmospheric pressure.

[2] The temperature control unit according to the above [1], wherein the aforementioned temperature control medium is at least one selected from the group consisting of hydrofluorocarbons and hydrofluoro ethers.

[3] The temperature control unit according to the above [1], wherein the aforementioned temperature control medium is 1,1,2,2,3,3,4-heptafluorocyclopentane.

[4] The temperature control unit according to any one of the above [1] to [3], wherein the aforementioned metal body is a porous metal body.

[5] The temperature control unit according to any one of the above [1] to [3], wherein the aforementioned metal body is a metal fiber body.

[6] The temperature control unit according to the above [5], wherein the aforementioned metal fiber body is a metal fiber sheet containing copper fibers.

[7] The temperature control unit according to any one of the above [1] to [6], further containing a housing body for accommodating the aforementioned metal body.

[8] The temperature control unit according to the above [7], wherein the housing body is composed of at least one material selected from the group consisting of a copper plate, an aluminum plate, a copper foil, and an aluminum foil.

[9] The temperature control unit according to any one of the above [1] to [6], further containing a support body for supporting the aforementioned metal body, wherein a hollow portion serving as an external channel for introducing the aforementioned temperature control medium into the channel is formed in the aforementioned support body.

[10] The temperature control unit according to the above [9], wherein a through-hole through which the aforementioned temperature control medium is led out from the aforementioned hollow portion toward the aforementioned metal body is formed in the aforementioned support body.

[11] The temperature control unit according to the above [9] or [10], further containing a lid body for covering the aforementioned metal body.

[12] The temperature control unit according to the above [6], further containing a first metal layer provided on an upper side of the metal fiber sheet and a second metal layer provided on a lower side of the metal fiber sheet.

[13] The temperature control unit according to any one of the above [1] to [12], wherein at least one part of the aforementioned temperature control medium exists in the aforementioned space in a solid state.

[14] The temperature control unit according to any one of the above [1] to [13], further containing a decompression portion that depressurizes the aforementioned space.

[15] A temperature control device containing the temperature control unit as recited in any one of the above [1] to [14], a storage unit for storing the aforementioned temperature control medium, a supply unit for supplying the aforementioned temperature control medium from the storage unit to the channel, and a recovery unit for recovering the aforementioned temperature control medium from the channel to the storage unit.

[16] The temperature control device according to the above [15], further containing a bypass path connecting the aforementioned supply unit and the aforementioned recovery unit.

Advantageous Effects of the Invention

According to the present invention, a temperature control unit is provided that is capable of efficiently controlling the temperature of an object by reducing the risk of failure of electronic components caused by leakage of a temperature control medium.

EMBODIMENTS OF THE INVENTION

Figure 1:
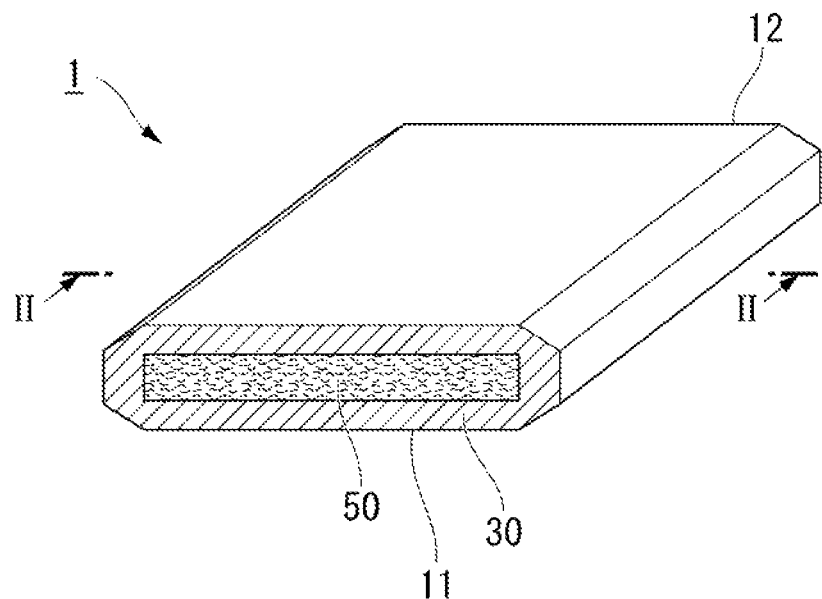
FIG. 1 is a perspective view which shows a temperature control unit of a 1$^{st}$ Embodiment.

The definitions of the following terms can be applied throughout the specification and claims.

A "latent heat of evaporation" is endothermic energy generated when a temperature control medium changes a state from a liquid state to a gaseous state. The latent heat of evaporation can be measured, for example, by an endothermic peak when the temperature control medium is measured by a differential scanning calorimeter (DSC).

A "coefficient of volume expansion" is a volume change rate of a temperature control medium when the temperature control medium changes a state from a liquid state to a gaseous state under atmospheric pressure. The coefficient of volume expansion can be obtained from a ratio of a volume of the temperature control medium in the liquid state and a volume of the temperature control medium when it is evaporated. The volume when the temperature control medium is evaporated can be obtained by an ideal gaseous state equation (PV=nRT).

"~" indicating a numerical range means that the numerical values described before and after the numerical range are included as the lower limit value and the upper limit value.

<Temperature Control Unit>

A temperature control unit of the present invention controls a temperature of an object. For example, the temperature of the object can be adjusted by directly or indirectly bringing the object to be temperature-controlled into contact with a metal body. Hereinafter, in the present specification, an object subjected to be temperature-controlled may be described as a heating element.

The temperature control unit of the present invention is equipped with a temperature control medium and a metal body.

The temperature control medium is a material for changing the temperature of the metal body. In particular, the temperature control medium exists in a space that serves as a channel for the temperature control medium, formed on the metal body. The temperature control unit of the present invention controls the temperature of the object by means of the temperature control medium which acts on the metal body from the space mentioned above to change the temperature of the metal body.

The temperature of the temperature control medium may be higher or lower than the temperature of the object.

In the case where the temperature of the temperature control medium is higher than the temperature of the object, the temperature control unit of the present invention utilizes heat exchange between the temperature control medium and the metal body to control the temperature of the object so as to increase the temperature of the object.

In the case where the temperature of the temperature control medium is lower than the temperature of the object, the temperature control unit of the present invention utilizes heat exchange between the temperature control medium and the metal body to control the temperature of the object so as to decrease the temperature of the object.

In the temperature control unit of the present invention, at least a part of the temperature control medium exists in a liquid state.

For example, in the case where the temperature of the temperature control medium is lower than the temperature of the object, at least a part of the temperature control medium existing in the liquid state absorbs heat from the object via the metal body, and the temperature of the temperature control medium in the liquid state rises. As a result, the temperature of the object falls. The heat transferred from the object to the temperature control unit while the temperature of the temperature control medium in the liquid state is rising is utilized as sensible heat.

Then, when the temperature of the temperature control medium in the liquid state rises to near the boiling point, the heat transferred from the object to the temperature control unit is utilized as latent heat of evaporation when the temperature control medium changes the state from a liquid to a gas. As described above, in the case where the temperature of the temperature control medium is lower than the temperature of the object, the temperature control unit of the present invention can utilize the heat absorption generated when the temperature control medium changes the state from a liquid to a gas in order to control the temperature of the object.

In the temperature control unit of the present invention, all of the temperature control media may exist in a liquid state, although it depends on the type or the boiling point of the temperature control medium, and the temperature of the temperature control unit.

In the temperature control unit of the present invention, at least a part of the temperature control medium may exist in a solid state.

For example, in the case where the temperature of the temperature control medium is lower than the temperature of the object, if at least a part of the temperature control medium is present in a solid state, the temperature control medium absorbs heat from the object via the metal body and the temperature of the temperature control medium in the solid state rises. Thereby, the temperature of the object falls. The heat transferred from the object to the temperature control unit is utilized as sensible heat, while the temperature of the temperature control medium in the solid state is rising.

Subsequently, when the temperature of the temperature control medium rises to near the melting point, the heat transferred from the object to the temperature control unit is utilized as latent heat of melting when the temperature control medium changes the state from a solid to a liquid. As described above, in the case where the temperature control medium exists in the space serving as a channel in the solid state, the temperature control unit of the present invention can utilize heat absorption that has occurred when the temperature control medium changes the state from a solid to a liquid in order to control the temperature of the object.

In addition, the temperature of the temperature control medium changed from the solid state to the liquid state rises to near the boiling point of the temperature control medium by absorbing heat from the object as sensible heat. Then, when the temperature of the temperature control medium reaches the boiling point, the heat transferred from the object to the temperature control unit is utilized as latent heat of evaporation when the temperature control medium changes the state from a liquid to a gas.

As described above, in the temperature control unit of the present invention, in the case where at least a part of the temperature control medium exists in a solid state, both the latent heat of evaporation and the latent heat of melting can be utilized to control the temperature of the object when heat is absorbed from the object. The latent heat of evaporation and the latent heat of melting are usually larger than the sensible heat. For this reason, an effect of effectively absorbing heat from the object can be expected without excessively increasing a usage amount of the temperature control medium, and the temperature of the object can be further efficiently adjusted.

In the present invention, the latent heat of evaporation of the temperature control medium ranges from 70 to 200 kJ/kg, preferably ranges from 100 to 150 kJ/kg, more preferably ranges from 120 to 150 kJ/kg, and even more preferably ranges from 120 to 145 kJ/kg.

When the latent heat of evaporation is at least the lower limit value of the numerical range mentioned above, an effect of sufficiently lowering the temperature of the metal body can be expected, and the temperature of the object can be efficiently adjusted.

When the latent heat of evaporation is at most the upper limit value of the numerical range mentioned above, it is possible to suppress an excessive decrease in the temperature of the metal body and prevent an unintended temperature decrease. Therefore, when the latent heat of evaporation is at most the upper limit value of the numerical range mentioned above, the temperature of the object can be efficiently adjusted.

In the present invention, the coefficient of volume expansion of the temperature control medium is 250 times or less, and preferably 240 times or less.

The lower limit value of the coefficient of volume expansion is not particularly limited. The lower limit value of the coefficient of volume expansion may be, for example, 200 times or more, 150 times or more, or 50 times or more.

When the coefficient of volume expansion is equal to or less than the upper limit value of the numerical range mentioned above, it is possible to prevent rapid expansion of the temperature control medium. For this reason, the temperature control medium in the gaseous state is less likely to escape from the space inside the metal body, which is the channel of the temperature control medium, due to rapid expansion. As a result, in the electronic equipment around the temperature control unit, the risk of failure due to leakage of the temperature control medium can be reduced. In addition, the volume secured for evaporation of the temperature control medium can be reduced, and for this reason, there is an advantage in that the temperature control unit or the like can be designed to be relatively compact.

As the temperature control medium, a fluorine-based compound is preferable, at least one material selected from the group consisting of hydrofluorocarbons and hydrofluoroethers is preferable, and fluorocarbons may be used. In addition, in the case where the temperature control unit is used for temperature control of electronic components, the temperature control medium is preferably an insulating, non-flammable compound having low environmental load, because such a compound hardly affects the surrounding electronic components.

The hydrofluorocarbon may be linear or cyclic.

As examples of linear hydrofluorocarbons, mention may be made of 1,1,1,2,4,4,4-heptafluoro-n-butane, 1,1,1,2,2,3,5,5,5-nonafluoro-n-pentane, 1,1,1,2,2,4,5,5,5-nonafluoro-n-pentane, 1,1,1,2,2,3,3,4,6,6,6-undecafluoro-n-hexane, 1,1,1, 2,2,3,3,5,6,6,6-undecafluoro-n-hexane, 1,1,1,2,2,4,5,5,6,6,6-undecafluoro-n-hexane and the like.

As examples of cyclic hydrofluorocarbons, mention may be made of 1,1,2,2,3-pentafluorocyclobutane, 1,1,2,2,3,3,4-heptafluorocyclopentane, 1,1,2,2,3,3,4,4,5-nonafluorocyclohexane, and the like.

Among these, the cyclic hydrofluorocarbons are preferable, and as the hydrofluorocarbon, 1,1,2,2,3,3,4-heptafluorocyclopentane is particularly preferable. As examples of commercially available 1,1,2,2,3,3,4-heptafluorocyclopentane, mention may be made of ZEORORA H.

For example, the latent heat of evaporation of ZEORORA H is 144 kJ/kg, and the coefficient of volume expansion thereof is 235 times.

On the other hand, the latent heat of evaporation of water ($H_2O$) is 2257 kJ/kg, and the coefficient of volume expansion thereof is 1699 times. In addition, the latent heat of evaporation of ethanol ($C_2H_5OH$) is 838 kJ/kg, and the coefficient of volume expansion thereof is 494 times.

As examples of the hydrofluoroethers, mention may be made of $C_3F_7OCH_3$, $C_3F_7OC_2H_5$, $C_4F_9OCH_3$, $C_4F_9OCH_2Cl$, $C_4F_9OC_2H_5$, $c\text{-}C_7F_{13}OCH_3$, $c\text{-}C_7F_{13}OC_2H_5$, $C_7F_{15}OCH_3$, $C_7F_{15}OC_3H_5$, $C_{10}F_{21}OCH_3$, and $C_{10}F_{21}OC_2H_5$.

The boiling point of the temperature control medium may range, for example, from 25 to 150° C., or may range from 50 to 100° C. The boiling point of the temperature control medium may be appropriately set according to the temperature of the object, that is, according to the temperature range of the object.

The melting point of the temperature control medium may range, for example, from −140 to 30° C., or may range from −130 to 25° C. The boiling point of the temperature control medium may be appropriately set according to the temperature of the object, that is, according to the temperature range of the object.

A space serving as a channel for the temperature control medium is formed in the metal body. The metal body is not particularly limited as long as it has a portion that can come into contact with the object to be temperature-controlled and a space that serves as a channel of the temperature control medium is formed. As examples of the metal body, mention may be made of, for example, a metal porous body and a metal fiber body.

As examples of the metal porous body, mention may be made of, for example, porous metals such as stainless steel, nickel, chromium, titanium, titanium alloy, copper, copper alloy, aluminum, and aluminum alloy.

As examples of the metal fiber body, mention may be made of, for example, a metal fiber sheet described later. The metal fiber body is not particularly limited as long as it is a metal body composed of metal fibers.

The metal fiber sheet will be described.

The metal fiber sheet may be composed of the metal fiber alone or may be formed in combination with a fiber other than the metal fiber.

The metal components constituting the metal fibers are not particularly limited. Specific examples include, for example, copper, stainless steel, iron, aluminum, nickel, chromium and the like. The metal component may be a precious metal such as gold, platinum, silver, palladium, rhodium, iridium, ruthenium and osmium.

Among these, copper, stainless steel and aluminum are preferable as the metal component constituting the metal fiber. In particular, copper fiber is superior in terms of the balance between rigidity and plastic deformability, and is also preferable from the viewpoint of the balance between heat conduction performance and economy. For this reason, the metal fiber sheet is preferably a metal fiber sheet containing copper fibers.

As examples of ingredients other than metal, mention may be made of organic substances having adhesiveness and carriability such as a polyethylene terephthalate (PET) resin, a polyvinyl alcohol (PVA), a polyolefin such as polyethylene or polypropylene, a polyvinyl chloride resin, an aramid resin, a nylon and acrylic resin, and fibers of these. These organic substances can be used, for example, to assist or improve a morphological maintenance property and functionality during the preparation of metal fiber sheets.

The structure of the metal fiber sheet is not particularly limited as long as it is in the form of a sheet, and any sheet structure can be applied. For example, the sheet structure of the metal fiber sheet may be a non-woven fabric in which metal fibers are randomly entangled, a woven fabric with regularity, or a mesh material.

In addition, the surface of the metal fiber sheet may be flat, or may have irregularities by subjecting it to a corrugation processing or the like, and is not particularly limited.

In the metal fiber sheet, metal fibers are preferably bound. The metal fibers being bound means that the metal fibers are physically fixed to each other to form a binding portion. In the metal fiber sheet, the metal fibers may be directly fixed to each other at the binding portion, or a part of the metal fibers may be indirectly fixed to each other via a component other than the metal component.

By binding the metal fibers, voids can be formed between the metal fibers constituting the metal fiber sheet. Such voids may be formed, for example, by entanglement of metal fibers. In the metal fiber sheet, a void is a space that serves as a channel for the temperature control medium.

A part of the temperature control medium enters the void formed in the metal fiber sheet, and the heat conducted from the object to the metal fiber sheet is efficiently conducted to the temperature control medium, so that the temperature control efficiency of the metal fiber sheet is further improved. The void rate of the metal fiber sheet preferably ranges from 30 to 99%, and more preferably ranges from 70 to 99%.

In the prior art such as the cooling device described in Patent Document 1, it can be considered that the space serving as the channel of the temperature control medium is increased as a countermeasure against leakage caused by the rapid expansion of the temperature control medium. However, if the space is increased, there is a problem in that it becomes difficult to apply the cooling device to, for example, electronic devices that are required to be miniaturized and thinned.

On the other hand, in the present invention, in the case where the temperature control unit is equipped with the metal fiber sheet as a metal body, the temperature control unit can be easily miniaturized and thinned, and can be easily applied to electronic equipment and the like that are required to be miniaturized and thinned. The metal fiber sheet is made by processing the metal fiber into a sheet shape. For this reason, it is easy to reduce the thickness of the sheet, and the space serving as the channel of the temperature control medium can be secured by the voids between the metal fibers.

The vertical thickness of the metal fiber sheet preferably ranges from 0.1 to 20 mm, and more preferably ranges from 0.5 to 10 mm. When the thickness of the metal fiber sheet is 0.1 mm or more, the temperature change of the metal fiber sheet due to the action of the temperature control medium is sufficient, and the temperature control efficiency of the temperature control unit is further improved. When the thickness of the metal fiber sheet is 20 mm or less, the temperature control unit can be easily made thinner. The thickness of the metal fiber sheet can be adjusted in the pressing process described later.

In the metal fiber sheet, it is preferable that the metal fiber be sintered at the binding portion. By subjecting the metal fibers to sintering, the thermal conductivity and homogeneity of the metal fiber sheet can be easily stabilized.

The thermal conductivity of the metal fiber sheet is preferably 1 W/m·K or more. When the thermal conductivity of the metal fiber sheet is 1 W/m·K or more, the efficiency of temperature control of the temperature control unit is further improved.

The basis weight of the metal fiber sheet preferably ranges from 30 to 5000 g/m$^2$, and more preferably ranges from 50 to 1800 g/m$^2$. When the basis weight of the metal fiber sheet is 30 g/m$^2$ or more, the temperature change of the metal fiber sheet due to the action of the temperature control medium is sufficient, and the efficiency of temperature control by the temperature control unit is further improved. When the basis weight of the metal fiber sheet is 5000 g/m$^2$ or less, the weight of the metal fiber sheet can be easily reduced, and the weight of the temperature control unit can be easily reduced.

The coefficient of variation (CV value) of the basis weight specified in JIS Z8101 per 1 cm$^2$ of the metal fiber sheet is preferably 10% or less. The basis weight is an index indicating the weight per unit volume. For this reason, it can be mentioned that the coefficient of variation of the basis weight being less than a certain value is a stable value for both the thermal conductivity and the space factor of the metal fiber sheet. That is, when the coefficient of variation of the basis weight of the metal fiber sheet is 10% or less, the metal fiber sheet is less likely to have lumps and voids of extremely large size, the homogeneity of the metal fiber sheet is superior, and the thermal conductivity of the temperature control unit becomes stable. As a result, the efficiency of heat exchange between the temperature control medium and the metal fiber sheet is stable, and the temperature of the metal fiber sheet can be changed with the more stable efficiency of heat exchange to control the temperature of the object. For this reason, the efficiency of temperature control of the object by the temperature control unit is further improved.

The lower limit value of the space factor of the metal fiber sheet is preferably 1% or more, more preferably 2% or more, and still more preferably 4% or more. The upper limit value of the space factor of the metal fiber sheet is preferably 70% or less, and more preferably 60% or less. If the space factor is less than 1%, the pressure loss at the time of introducing the temperature control medium can be suppressed, but the efficiency of temperature control (heat exchange) may be decreased due to an insufficient amount of the fibers. On the other hand, if the space factor exceeds 70%, the pressure loss at the time of introducing the temperature control medium may be increased.

The average fiber length of the metal fiber is not particularly limited. However, the average fiber length of the metal fiber preferably ranges, for example, from 1 to 10 mm, and more preferably ranges from 3 to 5 mm. When the average fiber length of the metal fiber is in the range of 1 to 10 mm, the thermal conductivity and homogeneity of the temperature control unit tend to be stabilized.

The average fiber diameter of the metal fiber is not particularly limited. However, the average fiber diameter of the metal fiber preferably ranges from 1 to 70 μm, more preferably ranges from 2 to 50 μm, and even more preferably ranges from 2 to 30 μm. If the average fiber diameter of the metal fibers is less than 1 μm, the rigidity of the metal fibers is lowered, and so-called lumps are likely to occur when the metal fiber sheet is manufactured. Due to the occurrence of lumps, the thermal conductivity and homogeneity of the metal fiber sheet become difficult to stabilize. If the average fiber diameter of the metal fibers exceeds 70 μm, the rigidity of the metal fibers may hinder fiber entanglement.

The shape of the cross section perpendicular to the longitudinal direction of the metal fiber can be any shape. The shape of such a cross section may be any shape such as a circular shape, an elliptical shape, a substantially quadrangular shape, and an amorphous shape.

The average fiber diameter of the metal fiber is a value calculated by using the projected area of the cross section perpendicular to the longitudinal direction of the fiber as the equivalent circle diameter. About 10 to 20 fibers may be selected, and the calculated fiber diameter thereof may be used as the average fiber diameter. In addition, in the case of a pyramidal fiber, the average fiber diameter may be obtained from the normal cross section of the portion having a length of ½ of the fiber length.

The aspect ratio of the metal fiber preferably ranges from 33 to 10000. If the aspect ratio is less than 33, entanglement of metal fibers is unlikely to occur, and the strength of the temperature control unit may be decreased. If the aspect ratio exceeds 10,000, the homogeneity of the metal fiber sheet may be decreased, and the thermal conductivity of the temperature control unit may become difficult to stabilize.

As examples of the method for producing the metal fiber sheet, mention may be made of a dry method in which metal fibers are compression-molded; a method in which a slurry containing metal fibers is made by a wet papermaking method and the like. In the case where a metal fiber sheet is obtained by a dry method, a web mainly composed of metal fibers obtained by a card method, an airlaid method, or the like can be compression-molded. During compression molding, the metal fibers may be impregnated with a binder in order to provide bonds between the metal fibers. As the binder, an organic binder such as an acrylic adhesive; or an inorganic binder such as colloidal silica can be used.

In the case where a metal fiber sheet is produced by a wet papermaking method, wet papermaking can be carried out by means of a paper machine using a slurry in which metal fibers or the like are dispersed in an aqueous medium. Additives such as fillers, dispersants, thickeners, defoamers, paper strength enhancers, sizing agents, flocculants, colorants and fixing agents may be added to the slurry.

A wet body sheet obtained by wet papermaking may be subjected to a fiber entanglement treatment step in which metal fibers and the like are entangled with each other. As the fiber entanglement treatment step, a method of injecting a high-pressure jet water flow onto the surface of the wet body sheet can be adopted. By using this method, metal fibers or fibers mainly composed of metal fibers can be entangled with each other over the entire sheet. After the step mentioned above is carried out, the wet body sheet is wound up through a dryer step.

A pressing step can be carried out on the sheet obtained through the fiber entanglement treatment step and the dryer step, before the metal fibers and the like are bound thereto. By carrying out the pressing step, extremely large voids formed between the metal fibers can be reduced and homogeneity can be improved. In addition, during the pressing process, the thickness of the metal fiber sheet can be adjusted by appropriately adjusting the pressure at the time of pressing.

As a method for binding the metal fibers and the like, a sintering step of sintering the metal fiber sheet is preferably carried out. By sintering and binding the metal fiber sheet, the metal fibers and the like can be reliably bound and the metal fibers can be fixed to each other. As a result, the coefficient of variation (CV value) of the basis weight of the metal fiber sheet becomes more stable and smaller. By carrying out the sintering step, the contact points of the metal fibers are bound to each other, the binding portion can be reliably provided, and the homogeneity and thermal conductivity of the metal fiber sheet are easily stabilized.

It is preferable that the metal fiber sheet subjected to the sintering step be further subjected to a pressing step. By further carrying out the pressing step after the sintering step, the homogeneity of the metal fiber sheet can be further improved and the metal fiber sheet can be made thinner. The pressing step after sintering causes a shift of metal fibers and the like not only in the thickness direction but also in the surface direction. Thereby, metal fibers and the like are arranged even in the places that were voids at the time of sintering, the homogeneity is improved, and such a state can be maintained by the plastic deformation properties which the metal fibers possess. The pressure in the pressing process performed after the sintering process can be appropriately set in consideration of the thickness of the metal fiber sheet.

Hereinafter, a plurality of embodiments to which the present invention is applied will be described. In the drawings used in the following description, the dimensional ratios and the like of each component are not always the same as the actual ones.

In the plurality of embodiments shown below, the same configuration will be described using the same reference numerals, and a duplicate description will be omitted.

First Embodiment

Figure 2:
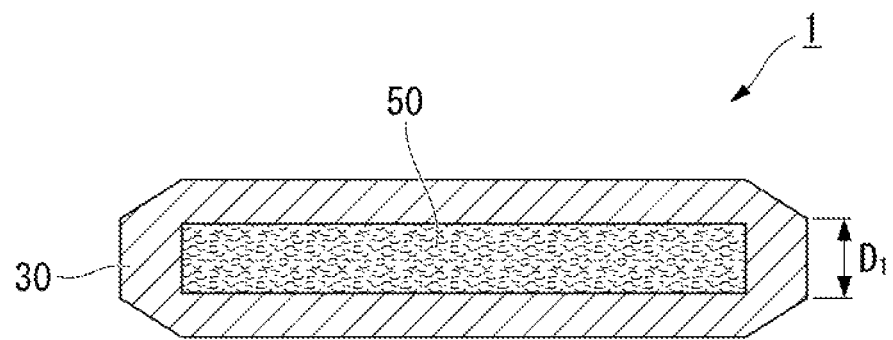
FIG. 2 is a sectional view taken along line II-II of the temperature control unit of FIG. 1.

FIG. 1 is a perspective view showing a temperature control unit of the first embodiment. FIG. 2 is a sectional view taken along line II-II of the temperature control unit of FIG. 1. In FIG. 2, "$D_1$" indicates the thickness of a metal fiber sheet 50 in a temperature control unit 1 of the first embodiment.

The temperature control unit 1 is equipped with a housing body 30 in addition to the metal fiber sheet 50 and a temperature control medium (not shown).

The housing body 30 accommodates the metal fiber sheet 50, which is an example of a form of the metal body in the present invention. The structure of the housing body 30 is not particularly limited as long as the temperature control medium can be introduced into the housing body 30. In the temperature control unit 1, the housing body 30 includes a first opening end portion 11 and a second opening end portion 12 As described above, both ends of the housing body 30 are open ends.

The temperature control medium introduced into the housing body 30 from the first opening end portion 11 controls the temperature inside the metal fiber sheet 50 or the like, and is derived from the second opening end portion 12. By providing the first opening end portion 11 and the second opening end portion 12, the temperature control medium can be introduced from the first end portion of the housing body 30 into the inside of the housing body 30, and can be derived from the second open end portion 12.

The shape of the housing body 30 is not particularly limited, and any structure and shape can be adopted. The housing body 30 can be composed of a metal material, a ceramic material, a resin material, or the like.

As examples of the metal material, mention may be made of stainless steel, copper, aluminum, alumina and the like. As examples of the ceramic material, mention may be made of zirconia, barium titanate, silicon carbide, silicon nitride, aluminum nitride and the like. As examples of the resin material, mention may be made of a polyacrylic acid resin such as polymethacrylic acid or polycyanoacrylic acid (polycyanoacrylate); a polyvinylpyrrolidone resin; a polyester resin such as polyethylene terephthalate; a polypropylene resin; a fluororesin such as polytetrafluoroethylene; a polyimide resin; a polyamide resin containing aramid; a polyparaphenylene benzobisoxazole resin and the like.

Among these, from the viewpoint of efficiency of temperature control, the material of the housing body 30 is preferably a metal material having high thermal conductivity such as stainless steel, copper, or aluminum.

In addition, it is preferable that at least one surface of the housing body 30 in contact with an object such as a heating element be composed of a heat conductive substance such as metal.

In the case where the housing body 30 is made of metal, it is preferable that the metal fiber sheet 50 and the housing body 30 be bound to each other. In the case where the metal fiber sheet 50 and the housing body 30 are bound to each other, the efficiency of heat exchange between the metal fiber sheet 50 and the housing body 30 is further improved.

As a method of binding the metal fiber sheet 50 and the housing body 30, for example, there is a method of arranging the housing body 30 on the metal fiber sheet 50 and then sintering them in the mode as shown in FIG. 1.

In the case where the housing body 30 is composed of a metal material, the sintering processing may be carried out in a mode in which the metal fiber sheet 50 is accommodated. By such a method, a temperature control unit in which the housing body 30 and the metal fiber sheet 50 are bound can be obtained. In the temperature control unit in which the housing body 30 and the metal fiber sheet 50 are bound, the heat from the heating element is easily propagated to the metal fiber sheet 50, and the efficiency of temperature control by the temperature control unit is further improved. For example, the housing body to be sintered is composed of at least one material selected from the group consisting of, for example, a copper plate, an aluminum plate, a copper foil, and an aluminum foil.

In the temperature control unit 1, the shape of the cross-section of the first opening end portion 11 and the second opening end portion 12 and the area of the opening surface can be arbitrarily selected. The efficiency of temperature control carried out by the temperature control unit 1 can be adjusted by appropriately selecting the area of the opening surface of the first opening end portion 11 and the second opening end portion 12. For example, in the case where it is desired to further increase the efficiency of temperature control, the area of the opening surface of the first opening end portion 11 is increased to enhance the efficiency of introducing the temperature control medium, and the temperature change of the metal fiber sheet due to the action of the temperature control medium may be increased.

The temperature control unit 1 may be further equipped with an introduction means for a temperature control medium (not shown) for introducing the temperature control medium into the housing body 30. The temperature control medium can be introduced into the housing body 30 by a means for introducing the temperature control medium. The means for introducing the temperature control medium is not particularly limited. As examples thereof, mention may be made of, for example, a means for introducing a temperature control medium such as a compressor or a liquid pump.

By introducing the temperature control medium into the housing body 30, the temperature of the metal fiber sheet 50 housed in the housing body 30 can be changed. In the case where the metal fiber sheet 50 is composed of copper fiber, aluminum fiber, or the like, the temperature of the metal fiber sheet 50 is likely to change due to the temperature control medium, and the temperature of the object can be efficiently adjusted.

In particular, in the case where the area of the opening surface of the first opening end portion 11 is small and it is difficult to introduce the temperature control medium, the introduction means can be preferably applied in order to further improve the efficiency of temperature control.

In the temperature control unit 1, the entire region of the metal fiber sheet 50 is housed in the housing body 30, but a part of the region of the metal fiber sheet 50 may be housed in the housing body 30. In this case, by introducing the temperature control medium into the housing body 30, the temperature of the metal fiber sheet 50 in a part of the region housed in the housing body 30 can be topically changed.

In the temperature control unit 1, both ends of the housing body 30 are open ends, but the temperature control unit 1 is not limited thereto, and only one end may be an open end, or both ends may be closed ends. However, in the case where both ends are closed ends, an introduction port for introducing the temperature control medium into the housing body 30 may be formed at an arbitrary position in the housing body 30. When the introduction port is formed in the housing body 30, an outlet port for deriving the temperature control medium from the inside of the housing body 30 may be further formed at an arbitrary position in the housing body 30.

Effect of the First Embodiment

In the temperature control unit 1, the metal fiber sheet 50 is housed inside the housing body 30. For this reason, in the temperature control unit 1, the temperature control medium is continuously held in the voids of the metal fiber sheet 50 by introducing the temperature control medium into the housing body 30. As a result, the temperature of the metal fiber sheet 50 is efficiently changed. By changing the temperature of the metal fiber sheet 50, the temperature of the housing body 30 in the portion in contact with the metal fiber sheet 50 can be changed integrally with the metal fiber sheet 50.

As described above, according to the temperature control unit 1, the temperature of the object can be effectively adjusted and controlled by bringing it into contact with the housing body 30 in the portion where the temperature change has occurred.

Second Embodiment

Figure 3:
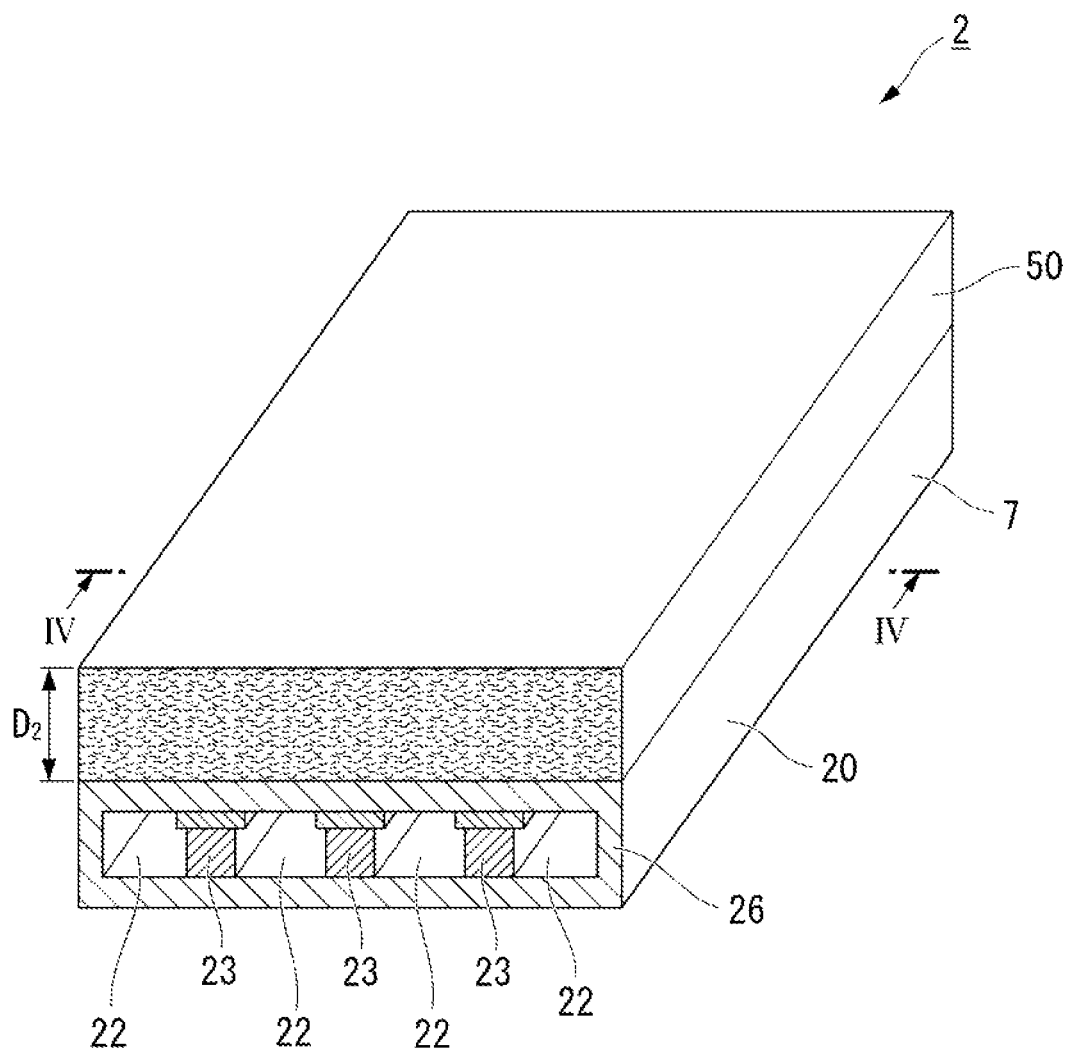
FIG. 3 is a perspective view which shows a temperature control unit of a 2$^{nd}$ Embodiment.
Figure 4:
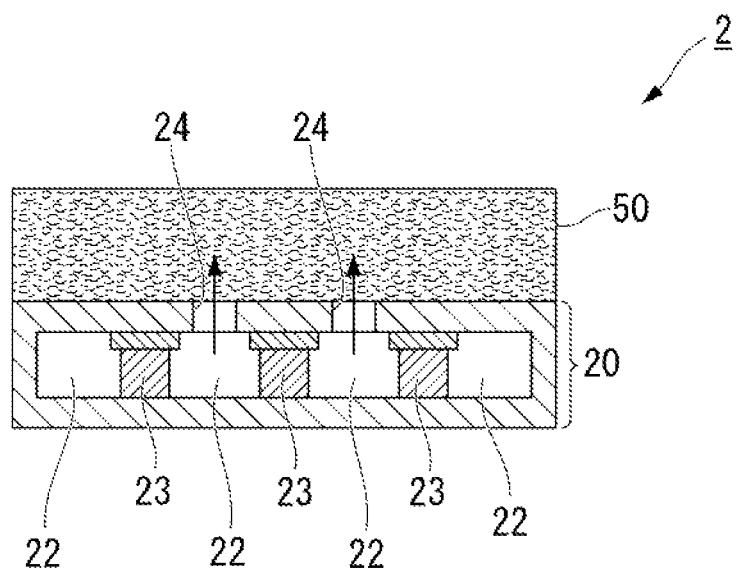
FIG. 4 is a sectional view taken along line IV-IV of the temperature control unit of FIG. 3.

FIG. 3 is a perspective view showing a temperature control unit of a second embodiment. FIG. 4 is a sectional view taken along line IV-IV of the temperature control unit of FIG. 3.

The temperature control unit 2 of the second embodiment is further equipped with a support body 20 in addition to the metal fiber sheet 50 and the temperature control medium (not shown). In FIG. 3, "$D_2$" indicates the thickness of the metal fiber sheet 50 in the temperature control unit 2. The arrow in FIG. 4 shows an example of the orientation of the temperature control medium derived from the through-hole 24.

The support body 20 supports the metal fiber sheet 50. A hollow portion 22 is formed in the support body 20. The hollow portion 22 is an external channel for introducing the temperature control medium into the gap of the metal fiber sheet 50 which serves as a channel of the temperature control medium.

As shown in FIG. 4, a partition portion 23 is provided inside the support body 20. In the temperature control unit 2, by providing the partition portion 23 inside the support body 20, a plurality of hollow portions 22 serving as an external channel of the temperature control medium are formed inside the support body 20.

A plurality of through-holes 24 are formed on the upper surface of the support body 20. The through-hole 24 penetrates the hollow portion 22 from the upper surface of the support body 20.

Due to the through-hole 24 formed on the upper surface of the support body 20, the temperature control medium flowing through the hollow portion 22 can be derived from the through-hole 24 toward the metal fiber sheet 50.

In the temperature control unit 2, the temperature control medium is introduced from the opening end portion 26 of the support body 20 into the hollow portion 22, which is an external channel. The temperature of the support body 20 is adjusted by flowing the temperature control medium in the hollow portion 22 which is an external channel. According to this, the temperature of the metal fiber sheet 50 at the portion in contact with the temperature-controlled support body 20 is adjusted. That is, the temperature control medium introduced into the hollow portion 22 can change the temperature of the metal fiber sheet 50 via the support body 20.

In addition, in the temperature control unit 2, the through-hole 24 is formed on the upper surface of the support body 20, and for this reason, the temperature control medium flowing through the hollow portion 22 is derived from the through-hole 24 toward the metal fiber sheet 50. The temperature control medium derived from the through-hole 24 is introduced into the voids present between the metal fibers (that is, the channel in the metal fiber sheet 50), and the temperature of the metal fiber sheet 50 can be changed by acting from the inside of the metal fiber sheet 50. The metal fiber sheet 50 is composed of metal fibers, and for this reason, the temperature of the metal fiber sheet 50 efficiently changes in the process in which the temperature control medium enters the voids present between the metal fibers and passes through the voids.

As described above, due to the through-hole 24 formed in the support body 20, the temperature control medium can directly reach the metal fiber sheet 50 from the hollow portion 22. For this reason, the temperature of the metal fiber sheet 50 can be effectively changed.

Here, the temperature control medium in which the temperature of the metal fiber sheet 50 is changed is derived from the metal fiber sheet 50, but the portion where the temperature control medium is derived from the metal fiber sheet 50 is not particularly limited. Such a portion may be provided at the upper surface of the metal fiber sheet 50 or the side surface of the metal fiber sheet 50.

The support body 20 can be composed of the same material as that of the housing body 30 described above. From the viewpoint of temperature control efficiency, the material of the support body 20 is preferably a metal material having a high thermal conductivity.

The temperature control unit 2 can have an arbitrary three-dimensional shape depending on the purpose of use and the like. The three-dimensional shape of the temperature control unit 2 may be, for example, a columnar shape, an elliptical columnar shape, a polygonal columnar shape, or the like.

The shape and structure of the support body 20 are not particularly limited as long as the temperature control medium can be introduced into the hollow portion 22 inside the support body 20. In the case where the area of the opening surface of the opening end portion 26 is small and it is difficult to introduce the temperature control medium, or in the case where it is desired to further improve the efficiency of the temperature control, the introduction means for introducing the temperature control medium into the hollow portion 22 can be used. The means for introducing the temperature control medium is not particularly limited.

The whole diameter of the through-hole 24 is not particularly limited and can be arbitrarily set. The number of through-holes 24 is not particularly limited and can be arbitrarily set. The distance between the through-holes 24 may be regular or irregular.

In the temperature control unit 2, the thickness $D_2$ of the metal fiber sheet 50 in the vertical direction preferably ranges from 0.1 to 5 mm. When the thickness $D_2$ of the metal fiber sheet 50 is 0.1 mm or more, it is easy to sufficiently introduce the temperature control medium, and the temperature control efficiency of the temperature control unit 2 is further enhanced. When the thickness $D_2$ of the metal fiber sheet 50 is 5 mm or less, the metal fiber sheet 50 can be easily thinned, and the temperature control unit 2 can be easily thinned.

The temperature control unit 2 may be further equipped with other constitutions. As examples of other constitutions, mention may be made of a mounting portion for mounting the temperature control unit 2 on an object such as a heating element, an auxiliary member for introducing the temperature control medium from the opening end portion 26, and the like.

In the temperature control unit 2 shown in FIGS. 3 and 4, the lower surface of the metal fiber sheet 50 is covered with the support body 20, and the side surfaces and the upper surface of the metal fiber sheet 50 are open surfaces. However, the temperature control unit of the second embodiment is not limited to the form in which the side surfaces and the upper surface of the metal fiber sheet 50 are open surfaces, and may have the form in which the side surface or the upper surface of the metal fiber sheet 50 is not an open surface.

In the form in which the side surface or the upper surface of the metal fiber sheet 50 is not an open surface, the temperature control medium is not derived from the closed surface of the metal fiber sheet 50, and for this reason, the temperature control medium is efficiently derived to the open surface of the metal fiber sheet 50.

Effects of the Second Embodiment

In the temperature control unit 2 described above, the temperature of the support body 20 and the temperature of the metal fiber sheet 50 can be efficiently changed by flowing the temperature control medium through the hollow portion 22. In addition, the temperature control unit 2 is equipped with a partition portion 23, and for this reason, the temperature control medium introduced into the hollow portion 22 is derived to the channel formed by the partition portion 23. For this reason, the temperature control medium flowing through the hollow portion 22 is efficiently derived from the through-hole 24, and the temperature of the metal fiber sheet 50 can be efficiently changed. Therefore, according to the temperature control unit 2, the temperature of the object can be efficiently adjusted, and the efficiency of temperature adjustment is further enhanced.

In the temperature control unit 2, the magnitude of the temperature change and the efficiency of the temperature control can be controlled by adjusting the size of the voids formed inside the metal fiber sheet 50. For this reason, it is not necessary to increase the amount of the temperature control medium used for the purpose of increasing the temperature change of the metal fiber sheet. Therefore, according to the temperature control unit 2, the temperature of the object can be efficiently adjusted, and the efficiency of temperature control is further enhanced.

In addition, in the temperature control unit 2, the magnitude of the temperature change can be topically adjusted in the plane of the metal fiber sheet 50 by adjusting the hole size of the through-hole 24. For this reason, the temperature control unit 2 can control the flowing amount of the temperature control medium by adjusting the hole size of the through-hole 24, and can adjust the amount of temperature change at an arbitrary location. Therefore, according to the temperature control unit 2, the temperature of the object can be controlled while local adjustment is being carried out.

Third Embodiment

Figure 5:
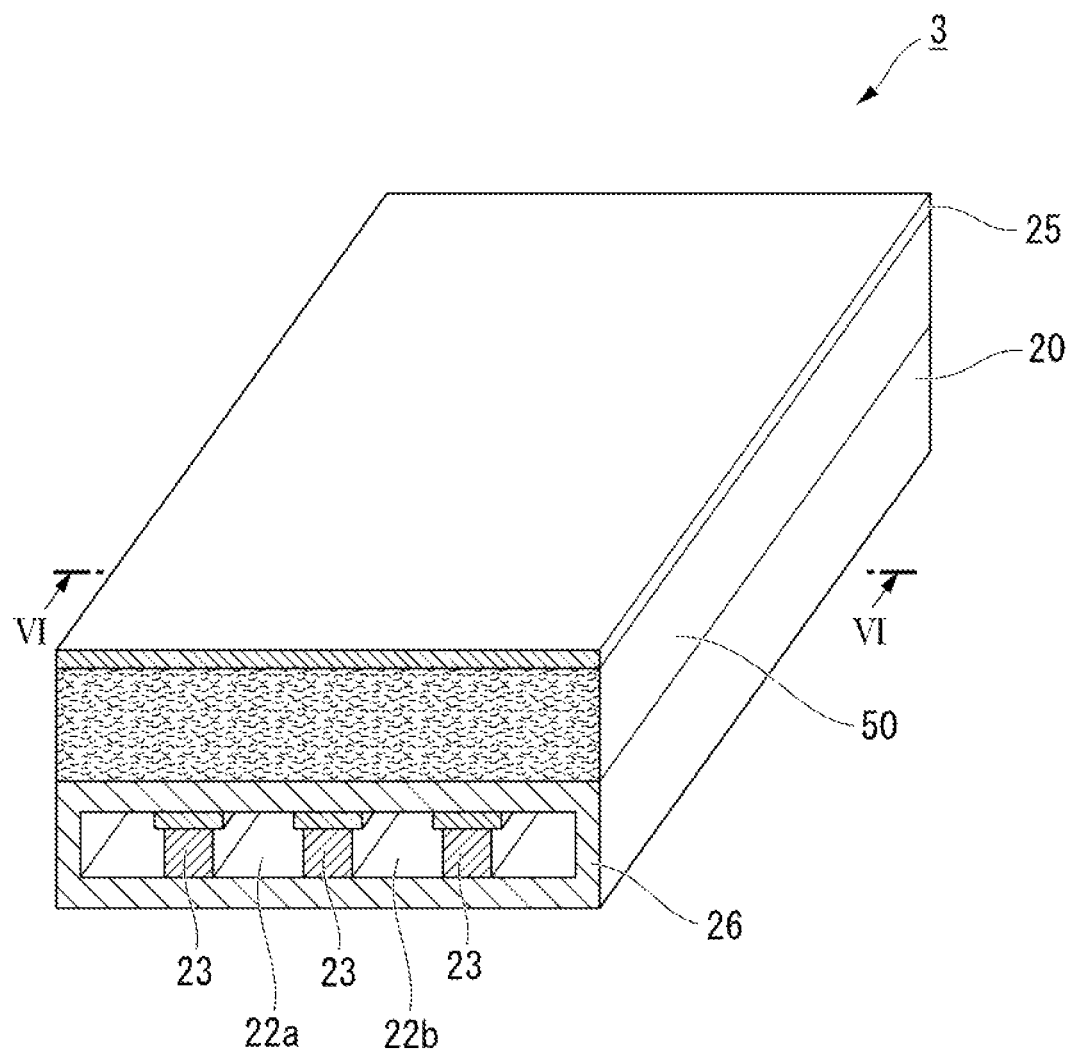
FIG. 5 is a perspective view which shows a temperature control unit of a 3$^{rd}$ Embodiment.
Figure 6:
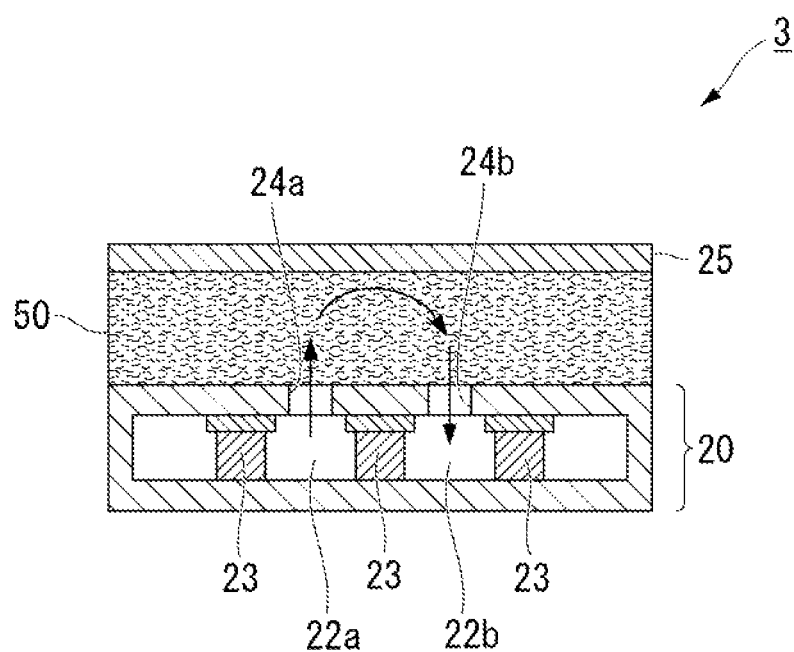
FIG. 6 is a sectional view taken along line VI-VI of the temperature control unit of FIG. 5.

FIG. 5 is a perspective view showing a temperature control unit of the third embodiment. FIG. 6 is a sectional view taken along line VI-VI of the temperature control unit of FIG. 5. The arrows in FIG. 6 indicate an example of the orientation of the temperature control medium flowing inside the temperature control unit of FIG. 5.

The temperature control unit 3 is further equipped with a lid body 25 in addition to the metal fiber sheet 50, the temperature control medium (not shown), and the support body 20. The lid body 25 covers the metal fiber sheet 50, which is a metal body.

In the temperature control unit 3, through-holes 24a and 24b are formed on the upper surface of the support body 20. The through-holes 24a and 24b penetrate the hollow portions 22a and 22b from the upper surface of the support body 20.

Here, the arrows in FIG. 6 indicate the direction of the temperature control medium introduced from the hollow portion 22a via the through-hole 24a into the void of the metal fiber sheet 50, and the direction of the temperature control medium derived from the void of the metal fiber sheet 50 via the through-hole 24b to the hollow portion 22b.

The through-hole 24a is formed on the upper surface of the support body 20, and for this reason, the temperature control medium flowing through the hollow portion 22a is derived from the through-hole 24a toward the void of the metal fiber sheet 50.

The through-hole 24b is formed on the upper surface of the support body 20, and for this reason, the temperature control medium in which the temperature of the metal fiber sheet 50 is changed is introduced into the hollow portion 22b, flows through the hollow portion 22b, and is derived from the opening end portion 26.

The hole sizes of the through-holes 24a and 24b are not particularly limited and can be set arbitrarily. The number of through-holes 24a and 24b is not particularly limited and can be set arbitrarily. The distance between the through-holes 24a and 24b may be regular or irregular.

In the temperature control unit 3, the lid body 25 covers the upper surface of the metal fiber sheet 50, and for this reason, it is difficult for the temperature control medium that has entered into the voids of the metal fiber sheet 50, to be derived to the outside of the temperature control unit 3 from the upper surface of the metal fiber sheet 50.

Therefore, in the temperature control unit 3, heat exchange occurs more effectively between the temperature control medium and the metal fiber sheet 50, and the temperature control medium can effectively change the temperature between the metal fiber sheet 50 and the lid body 25. As a result, in the case where the object is brought into direct contact with the lid body 25, the efficiency of temperature control of the object by means of the temperature control unit 3 is further improved.

The shape of the lid body 25 is not limited to the plate shape as shown in FIG. 5 and FIG. 6, and any structure and shape can be adopted. The lid body 25 can be composed of a known heat conductive material such as metal. As examples of such a heat conductive material, mention may be made of, for example, stainless steel, copper, aluminum and the like.

As the material of the lid body 25, a metal material having a high thermal conductivity is preferable in consideration of the efficiency of temperature control. For example, the lid body 25 can be composed of a copper plate, a copper foil, or the like. For example, in the case where the object and the lid body 25 are brought into direct contact with each other, heat is propagated from the heating element to the lid body 25 and the metal fiber sheet 50. At this time, heat exchange is performed between the propagated heat and the temperature control medium by the temperature control medium that passes while being held inside the metal fiber sheet 50.

As the material of the lid body 25, a material which easily exchanges heat with the object or a material which easily exchanges heat with the metal fiber sheet 50 is suitable.

In the temperature control unit 3 shown in FIG. 5 and FIG. 6, the side surfaces of the metal fiber sheet 50 are open surfaces. However, in the temperature control unit 3, the side surface of the metal fiber sheet 50 does not have to be an open surface. In the form in which the side surface of the metal fiber sheet 50 is not an open surface, the temperature control medium is preferentially derived from the hollow portion 22b.

For example, in the temperature control unit 3 shown in FIG. 5 and FIG. 6, the temperature control unit 1 may be laminated with the support body 20 instead of the metal fiber sheet 50 and the lid body 25. In this case, by forming a through-hole on the lower surface of the housing body 30, the temperature control medium introduced from the hollow portion 22a flows via the through-hole 24a and the through-hole formed on the lower surface of the housing body 30. Thereby, the temperature of the metal fiber sheet 50 which is housed inside the housing body 30 may be changed.

Effects of the Third Embodiment

The temperature control unit 3 described above is further equipped with the lid body 25, and for this reason, the efficiency of heat exchange between the temperature control medium and the metal fiber sheet 50 is further improved, and in addition, the efficiency of heat exchange between the temperature control unit 3 and the object is further improved. As described above, the temperature control unit 3 can efficiently exchange heat between the temperature control medium and the object via the metal fiber sheet 50, and for this reason, the efficiency of temperature control is dramatically increased.

In the temperature control unit 3, the efficiency of temperature control can be topically adjusted in the plane of the metal fiber sheet 50 by adjusting the hole sizes of the through-holes 24a and 24b. That is, according to the temperature control unit 3, the flow rate of the temperature control medium can be controlled by adjusting the hole sizes of the through-holes 24a and 24b, and the efficiency of temperature control at any location can be enhanced. Therefore, according to the temperature control unit 3, the temperature of the object can be topically adjusted by the metal fiber sheet 50 in the portion where the temperature change locally occurs.

In addition, in the temperature control unit 3, the magnitude of the temperature change of the metal fiber sheet 50 and the efficiency of temperature control of the object can be adjusted by adjusting the size of the voids formed inside of the metal fiber sheet 50. For this reason, the temperature control unit 3 can be easily made thinner and lighter without impairing the efficiency of temperature control.

Fourth Embodiment

Figure 7:
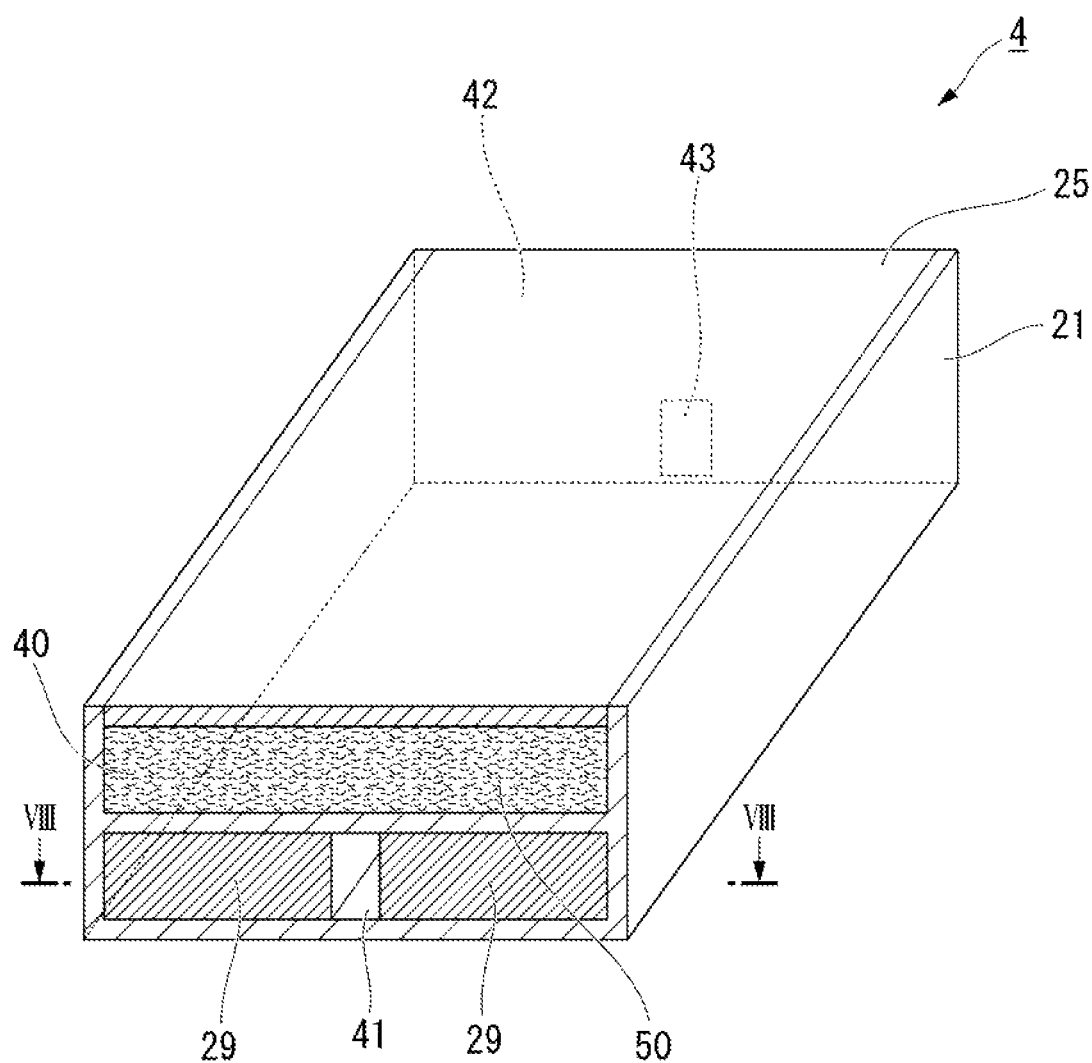
FIG. 7 is a perspective view which shows a temperature control unit of a 4$^{th}$ Embodiment.

FIG. 7 is a perspective view showing the temperature control unit of the fourth embodiment. The temperature control unit 4 is equipped with a metal fiber sheet 50, a temperature control medium (not shown), a support body 21, and a lid body 25. A hollow portion serving as an external channel of the temperature control medium is formed inside the support body 21. On a first end surface 40 of the support body 21, an introduction port 41 for introducing the temperature control medium into the hollow portion is formed. In addition, on a second end surface 42 of the support body 21, a temperature control medium derivation port 43 for deriving the temperature control medium from the hollow portion is formed.

Figure 8:
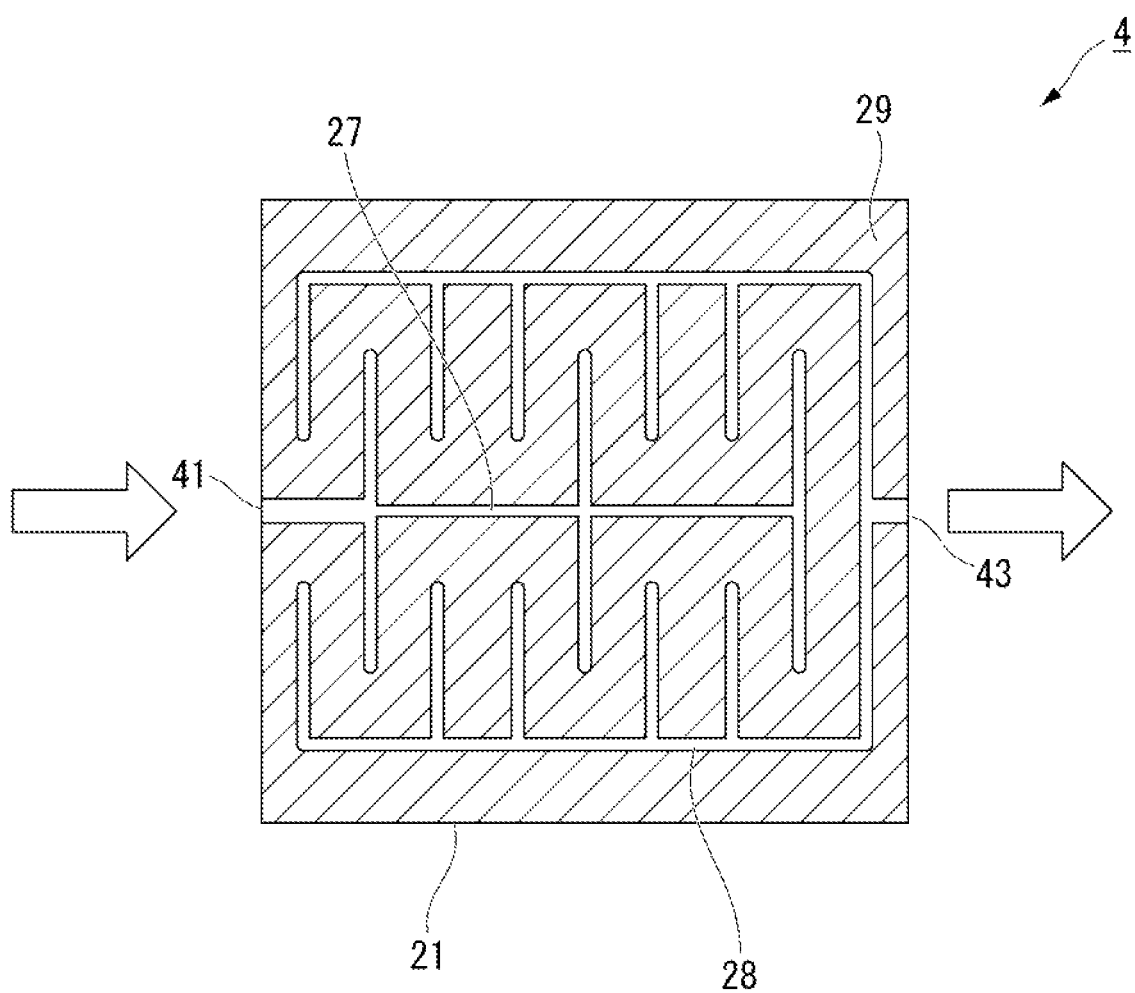
FIG. 8 is sectional view taken along line VIII-VIII of the temperature control unit of FIG. 7.

FIG. 8 is a sectional view taken along line VIII-VIII of the temperature control unit 4. The arrows in FIG. 8 indicate an example of the orientation of the temperature control medium introduced into the temperature control unit 4 and an example of the orientation of the temperature control medium derived from the temperature control unit 4. As shown in FIG. 8, a hollow portion 27 and a hollow portion 28, which serve as an external channel of the temperature control medium, are formed inside of the support body 21 of the temperature control unit 4. The hollow portion 27 and the hollow portion 28 are each formed by a partition portion 29.

Figure 9:
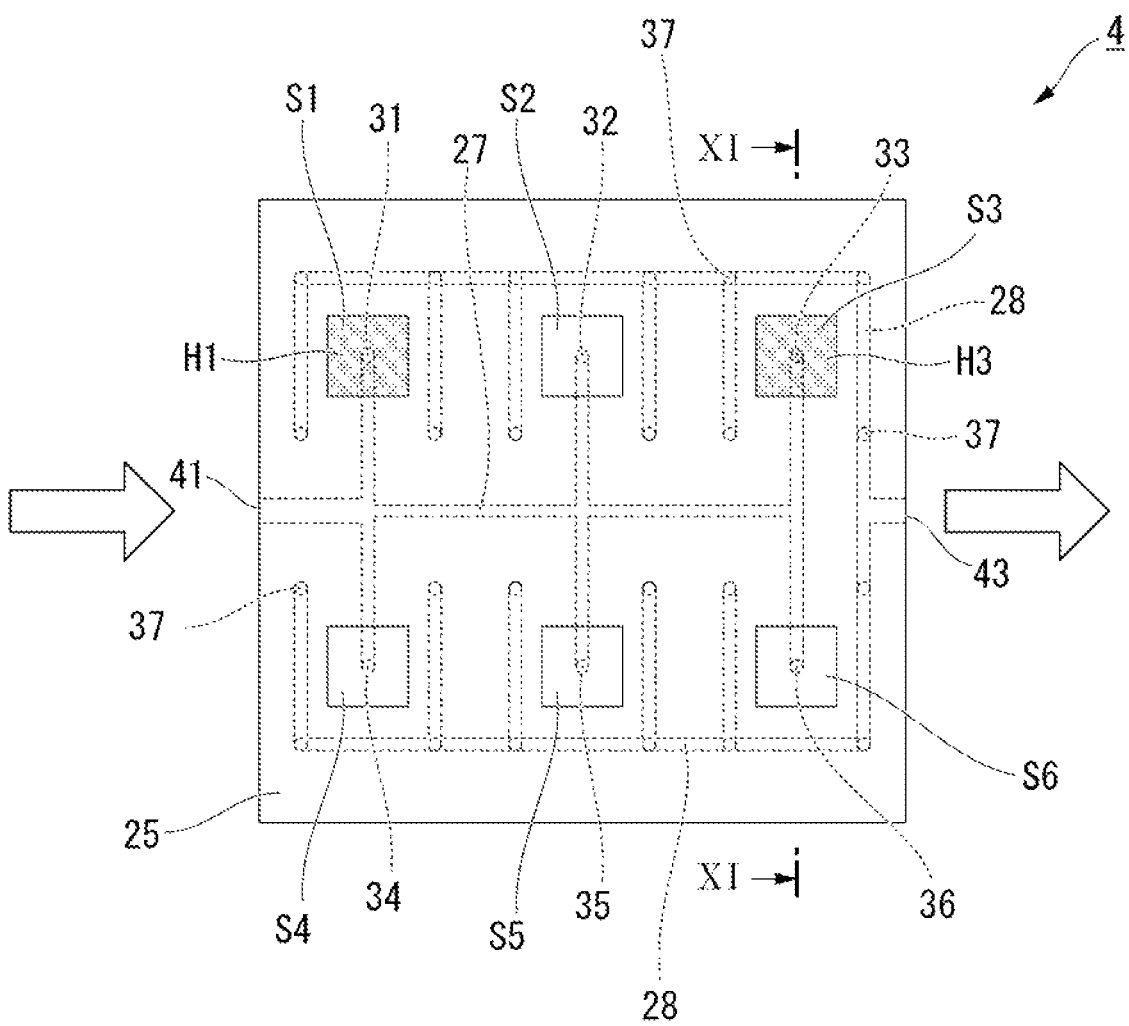
FIG. 9 is a top view of the temperature control unit of FIG. 7.

FIG. 9 is a top view of the temperature control unit 4.

The hollow portion 27 is branched into a plurality of portions according to the positions of the mounting portions S1 to S6. Each end portion of the plurality of branched hollow portions 27 is located at the lower part of each of the mounting portions S1 to S6.

The hollow portion 28 is branched into a plurality of portions according to the positions of the through-hole 37. Each of the plurality of branched hollow portions joins in the vicinity of a derivation port 43.

In the temperature control unit 4, the lid body 25 covers the upper surface of the metal fiber sheet 50. As shown in FIG. 9, a plurality of mounting portions S1 to S6 are provided on the upper surface of the lid body 25. Semiconductor devices (elements) such as IC chips and LEDs are mounted on the plurality of mounting portions S1 to S6.

Among these mounting portions S1 to S6, a heating element H1 and a heating element H3 are arranged in the mounting portion S1 and the mounting portion S3, respectively. Here, the dotted line in FIG. 9 indicates the hollow portion 27 and the hollow portion 28 formed inside of the support body 21.

Figure 10:
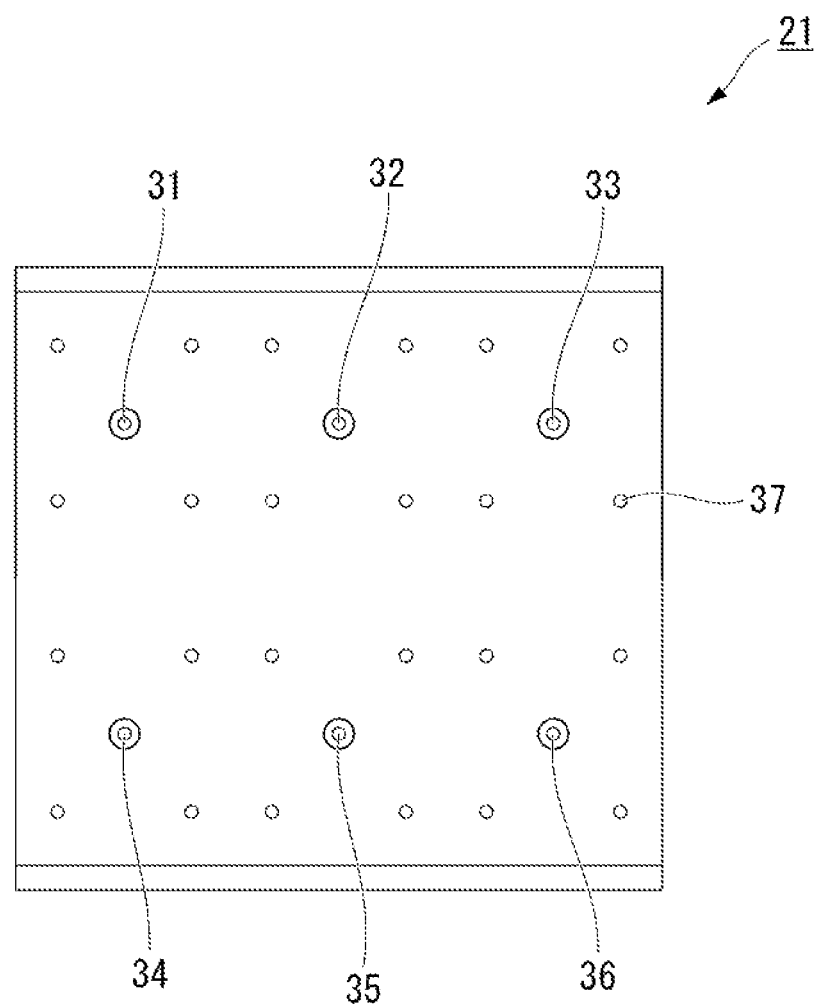
FIG. 10 is a top view which shows a support body of the temperature control unit of FIG. 7.

FIG. 10 is a top view showing the support body 21 of the temperature control unit of FIG. 7. As shown in FIG. 10, through-holes 31 to 36 penetrating the hollow portion 27 from the upper surface of the support body 21 are formed on the upper surface of the support body 21. Each of these through-holes 31 to 36 is formed on the upper surface of the support body 21 according to the positions of the mounting portions S1 to S6.

In addition, as shown in FIG. 10, a plurality of through-holes 37 penetrating from the upper surface of the support body 21 to the hollow portion 28 are formed on the upper surface of the support body 21. The plurality of through-holes 37 are formed on the upper surface of the support body 21 located around each of the through-holes 31 to 36.

As shown in FIG. 9, when the temperature control medium is introduced into the temperature control unit 4, the hollow portion 27 becomes an external channel of the temperature control medium introduced from the introduction port 41, and the hollow portion 28 becomes an external channel of the temperature control medium derived from the derivation port 43. When the temperature control medium is introduced into the temperature control unit 4, the flow of the temperature control medium is derived according to the positions of the mounting portions S1 to S6, and branched into a plurality of parts.

Figure 11:
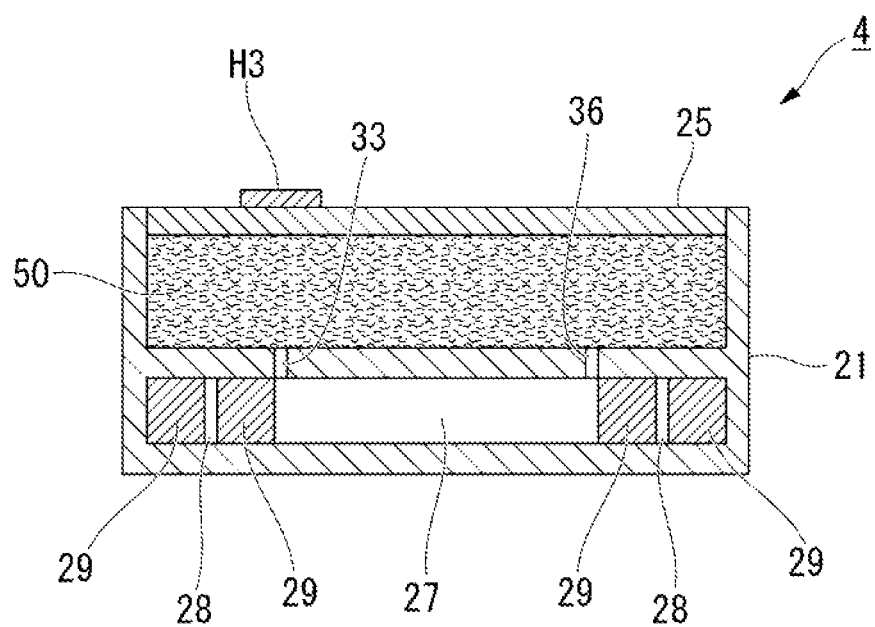
FIG. 11 is a sectional view taken along line XI-XI of FIG. 9.

FIG. 11 is a sectional view taken along the line XI-XI of FIG. 9. The flow of the temperature control medium branched into a plurality of portions in the hollow portion 27 is derived to the positions of the through-holes 31 to 36, and is derived from the through-holes 31 to 36. For example, the temperature control medium derived from the through-hole 33 is introduced into the voids of the metal fiber sheet 50. The temperature control medium introduced into the voids of the metal fiber sheet 50 exchanges heat with the heating element H3 via the metal fiber sheet 50 and the lid body 25.

Here, the through-hole 33 is formed in the support body 21 according to the position of the mounting portion S3. For this reason, the temperature of the mounting portion S3, which is in close proximity to the part of the metal fiber sheet 50 whose temperature has been topically changed, is also changed topically. Therefore, in the temperature control unit 4, the temperature of the mounting portion S3 is topically changed by the temperature control medium derived from the through-hole 33, and the temperature of the heating element H3 arranged in the mounting portion S3 among the plurality of mounting portions can be topically adjusted.

As described above, the temperature control medium derived from the through-holes 31 to 36 topically changes the temperature of each of the mounting portions S1 to S6 via the metal fiber sheet 50 around the through-holes 31 to 36, and the temperature of the heating element mounted on each mounting portion S1 to S6 is locally adjusted.

Here, for example, the temperature control medium in which the temperature of the heating element H3 is adjusted is introduced into the hollow portion 28 from the through-hole 37 formed around the through-hole 33, and is derived from the derivation port 43.

As shown in FIG. 11, in the temperature control unit 4, the lid body 25 covers the upper surface of the metal fiber sheet 50 in the same manner as that in the temperature control unit 3. In addition, in the temperature control unit 4, the support body 21 covers the side surface of the metal fiber sheet 50. For this reason, the temperature control medium that has entered the voids of the metal fiber sheet 50 is not led out to the outside of the temperature control unit 4 from either the upper surface or the side surface of the metal fiber sheet 50. For this reason, the temperature control unit 4 can control the flow of the temperature control medium more reliably than the temperature control unit 3, and the efficiency of heat exchange between the temperature control medium and the metal fiber sheet 50 can be extremely enhanced at a desired position.

The area of the channel surface of the hollow portions 27 and 28 is not particularly limited and can be set arbitrarily. For example, if the efficiency of temperature control due to the temperature control medium is desired to be relatively increased, the area of the channel surface may be increased. On the other hand, if the efficiency of temperature control is desired to be relatively set to a reduced value, the area of the channel surface may be decreased.

The hole sizes of the through-holes 31 to 37 are not particularly limited and can be set arbitrarily. For example, in order to realize more topical temperature control in the temperature control unit 4, the hole sizes of the through-holes 31 to 36, which are the lead-out holes of the temperature control medium, may be reduced. On the other hand, in order to realize higher temperature control efficiency in the control unit 4, the hole sizes of the through-holes 31 to 36 may be increased.

Effects of Fourth Embodiment

The temperature control unit 4 described above has a hollow portion 27 branched into a plurality of parts according to the positions of the mounting portions S1 to S6. For this reason, the temperature control unit 4 can efficiently derive the temperature control medium introduced from the introduction port 41 to the positions of the mounting portions S1 to S6. In addition, as described above, the temperature control medium derived to the positions of the mounting portions S1 to S6 can topically change the temperature of the metal fiber sheet 50 around the through-holes 31 to 36. By typically changing the temperature of the metal fiber sheet 50, the temperature of the lid body 25 of the portion where the mounting portions S1 to S6 are provided is also topically changed. Therefore, the temperature of the heating elements arranged in the mounting portions S1 to S6 can be topically adjusted.

In addition, the temperature control unit 4 can adjust the magnitude of the temperature change and the efficiency of heat exchange by appropriately selecting the shape of the hollow portion 27 and the hole sizes of the through-holes 31 to 36, and thereby, the temperature of the arranged heating element arranged at the mounting portions S1 to S6 can be selectively changed. Therefore, the temperature control unit 4 can arbitrarily select a heating element to be temperature-controlled according to the heat-generating state of the heating element mounted on each mounting portion, and topically adjust the temperature.

For example, in a substrate or the like used for electric equipment or the like, each element of a different type, material, etc. mounted on the identical substrate may have a different upper limit of the allowable heat-resistant temperature. In this case, it is required to preferentially cool an element having a lower allowable temperature over other elements. In such a case, it is more efficient to topically adjust the temperature of each element to a low temperature, for example, as compared to adjusting the temperature of the entire substrate according to the element having the lowest allowable temperature.

In addition, the temperature control unit 4 can be made thinner and lighter in the same manner as that of the temperature control unit 2 and that of the temperature control unit 3.

Fifth Embodiment

Figure 12:
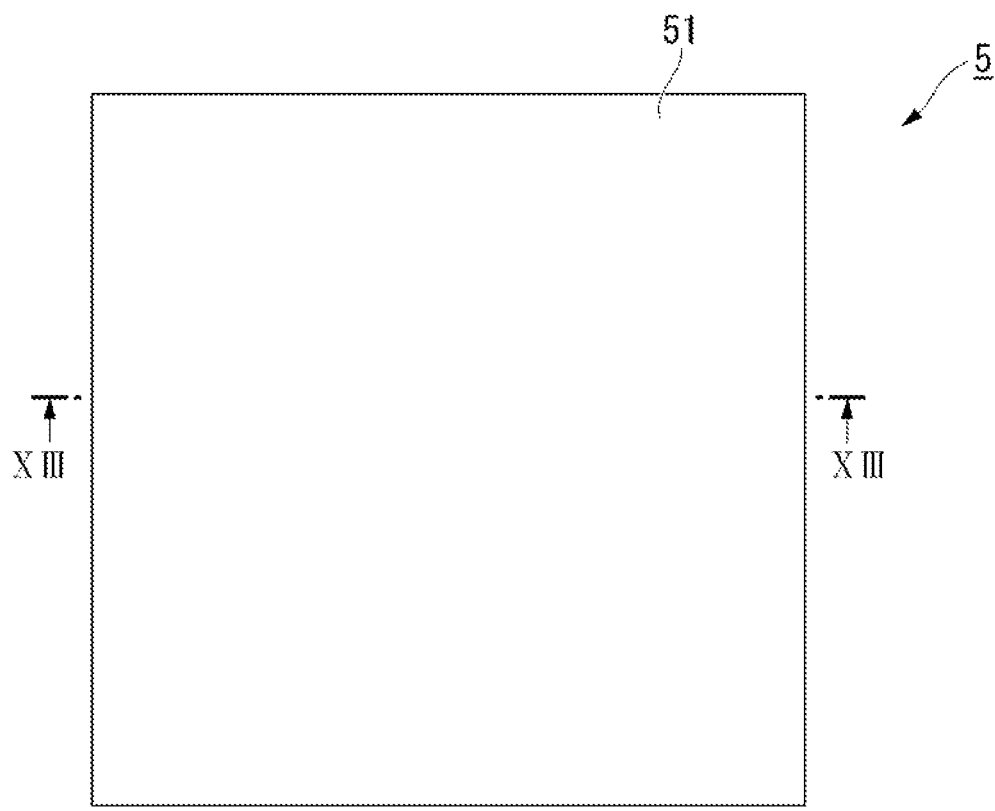
FIG. 12 is a top view which shows a temperature control unit of a 5$^{th}$ Embodiment.
Figure 13:
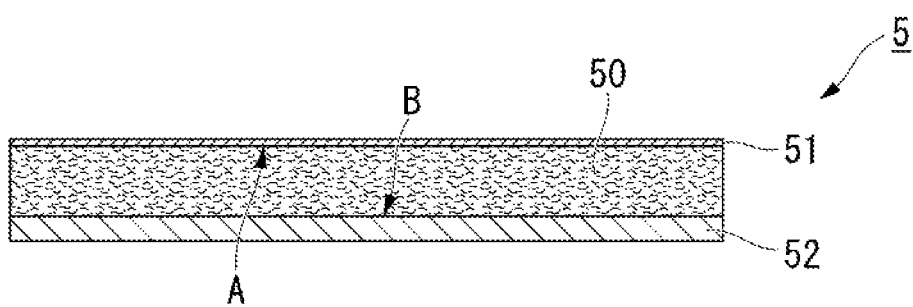
FIG. 13 is sectional view taken along line XIII-XIII of the temperature control unit of FIG. 12.
Figure 14:
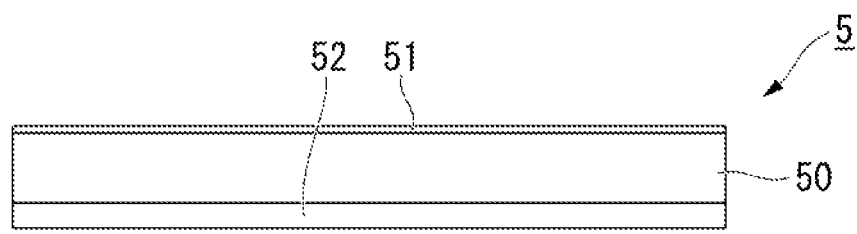
FIG. 14 is a side view of a temperature control unit of FIG. 12.

FIG. 12 is a top view showing a temperature control unit of a fifth embodiment. FIG. 13 is a sectional view taken along line XIII-XIII of the temperature control unit of FIG. 12. FIG. 14 is a side view of the temperature control unit of FIG. 12.

The temperature control unit 5 of the fifth embodiment is further equipped with a first metal layer 51 provided on the upper side of the metal fiber sheet 50, a second metal layer 52 provided on the lower side of the metal fiber sheet 50 A, and a means for introducing a temperature control medium (not shown), in addition to the metal fiber sheet 50 and the temperature control medium (not shown).

As shown in FIG. 13, the first metal layer 51 is a layer in contact with a first surface A of the metal fiber sheet 50. The first surface A is the upper surface of the metal fiber sheet 50. The second metal layer 52 is a layer in contact with a second surface B of the metal fiber sheet 50. In the temperature control unit 5, the second surface B is the lower surface of the metal fiber sheet 50 and is a parallel surface facing to the first surface A. As described above, the metal fiber sheet 50 is sandwiched between the first metal layer 51 and the second metal layer 52.

The first metal layer 51 and the second metal layer 52 may be a metal plate or a metal foil. The type of the material for the metal plate or metal foil is not particularly limited. The particular and preferable embodiments of the material of the metal plate or metal foil are the same as those described for the material of the metal fiber sheet 50.

The material of the first metal layer 51 and the material of the second metal layer 52 may be different from each other or may be the same.

The thickness of the first metal layer 51 and the second metal layer 52 is not particularly limited. From the viewpoint of the flexibility of the temperature control unit 5, the thickness of the first metal layer 51 preferably ranges from 18 to 500 µm, and the thickness of the second metal layer 52 preferably ranges from 100 to 5000 µm.

When the thickness of each of the first metal layer 51 and the second metal layer 52 is equal to or greater than the respective lower limit value, the durability of the temperature control unit 5 is improved. When the thickness of each of the first metal layer 51 and the second metal layer 52 is not more than the respective upper limit values, the temperature control unit 5 exhibits superior flexibility.

The thickness of the first metal layer 51 and the thickness of the second metal layer 52 may be different from each other or may be the same.

In the temperature control unit 5, the first metal layer 51 is a metal foil and the second metal layer 52 is a metal plate. In this case, the metal foil (first metal layer 51) is preferably a copper foil or an aluminum foil, and is more preferably a copper foil. As the metal plate (second metal layer 52), a copper plate or an aluminum plate is preferable, and a copper plate is more preferable.

In the temperature control unit 5, the thickness of the first metal layer 51 (metal foil) is thinner than the thickness of the second metal layer 52 (metal plate). In this case, the thickness of the first metal layer 51 (metal foil) preferably ranges from 18 to 500 µm in consideration of the durability, flexibility and ease of processing of the temperature control unit 5. The thickness of the second metal layer 52 (metal plate) preferably ranges from 100 to 500 µm.

As described above, when the first metal layer 51 is a metal foil and the second metal layer 52 is a metal plate, the temperature control unit 5 exhibits superior flexibility and the processing of the temperature control unit 5 further becomes easier.

In the temperature control unit 5, the first metal layer 51 and the second metal layer 52 are parallel to each other, but the present invention is not limited to the mode in which the first metal layer 51 and the second metal layer 52 are parallel to each other.

The means for introducing the temperature control medium is not particularly limited as long as the temperature control medium can be directly introduced into the metal fiber sheet 50.

As described above, the temperature control unit 5 has the first metal layer 51, the second metal layer 52, and the means for introducing the temperature control medium (not shown). For this reason, by introducing the temperature control medium into the voids of the metal fiber sheet 50, the temperature of the metal fiber sheet 50 can be changed.

In the temperature control unit 5, the metal fiber sheet 50 is sandwiched between the first metal layer 51 and the second metal layer 52. For this reason, the temperature control unit 5 may be a laminate having the metal fiber sheet 50, the first metal layer 51, and the second metal layer 52. The metal fiber sheet 50 is made of a flexible material in the form of a sheet, and for this reason, the temperature control unit 5 exhibits superior processability. Therefore, by previously preparing the temperature control unit 5 having a relatively large size, the temperature control unit 5 can be used as a precursor (base material) of the temperature control unit having an arbitrary size and the temperature control unit having an arbitrary shape. That is, the temperature control unit 5 can be used as a base material when the size is relatively large.

As the base material, for example, as described in the sixth embodiment described later, a plurality of groove portions may be formed on the surface of the metal layer by processing, the surface of the metal layer may be arbitrarily deformed and used, and the base material may be divided into two or more parts and used for manufacture of a relatively subdivided temperature control unit. That is, the base material can be used as a laminate for the manufacture of temperature control units of any shape and size.

Effects of Fifth Embodiment

The temperature control unit 5 is further equipped with the first metal layer 51 and the second metal layer 52 in addition to the metal fiber sheet 50, and for this reason, the temperature of the metal fiber sheet 50 can be efficiently changed, and the temperature changes of the first metal layer 51 and the second metal layer 52 in contact with the metal fiber sheet 50 can be more efficiently exhibited. Therefore, according to the temperature control unit 5, the temperature of the object can be efficiently adjusted.

Sixth Embodiment

Figure 15:
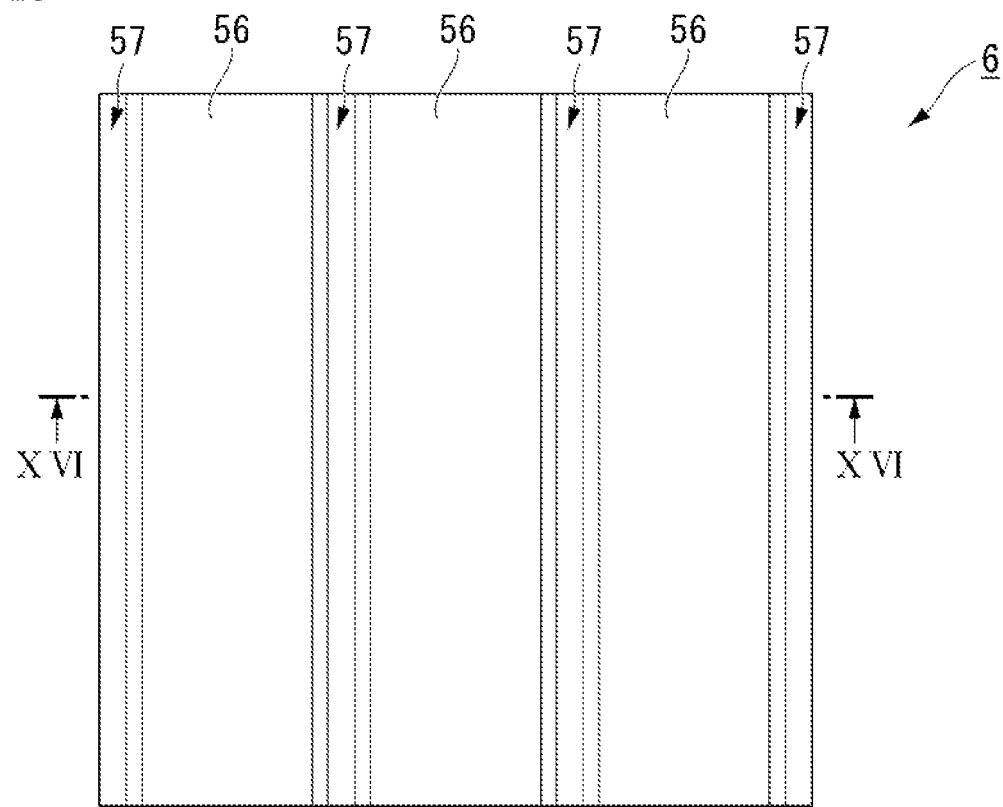
FIG. 15 is a top view which shows a temperature control unit of a 6$^{th}$ Embodiment.
Figure 16:
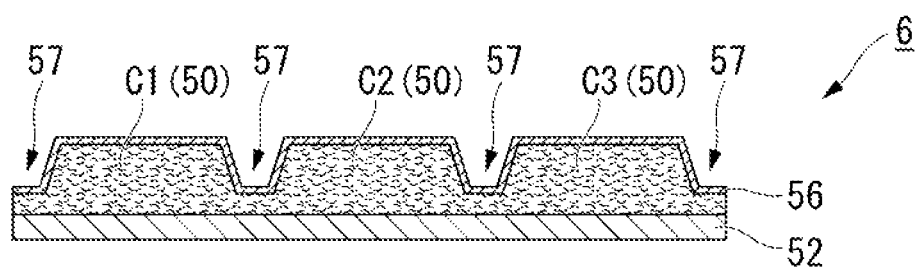
FIG. 16 is a sectional view taken along line XVI-XVI of the temperature control unit of FIG. 15.
Figure 17:
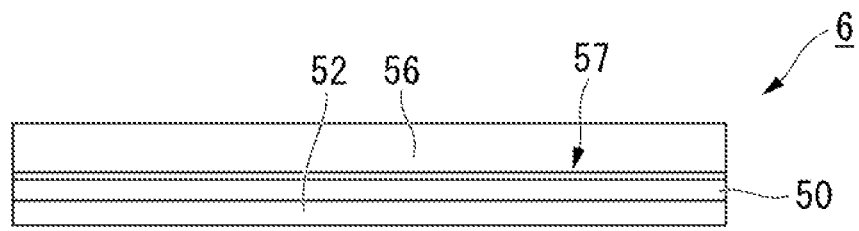
FIG. 17 is a side view of the temperature control unit of FIG. 15.

FIG. 15 is a top view showing a temperature control unit of a sixth embodiment. FIG. 16 is a sectional view taken along the line XVI-XVI of the temperature control unit of FIG. 15. FIG. 17 is a side view of the temperature control unit of FIG. 15.

The temperature control unit 6 of the sixth embodiment is equipped with a first metal layer 56, a second metal layer 52, and a means for introducing a temperature control medium, which is not shown, in addition to a metal fiber sheet 50 and a temperature control medium (not shown).

In the temperature control unit 6, a plurality of groove portions 57 are formed on the surface of the first metal layer 56. The shape of the groove portion 57 is not particularly limited. In addition, the number of grooves may be one or a plurality. The position on the surface of the first metal layer 56 on which the groove portion 57 is formed is not particularly limited, and can be formed, for example, according to the desirable position of the channel of the temperature control medium.

As shown in FIG. 15 and FIG. 16, in the temperature control unit 6, the metal fiber sheet 50 is divided into regions C1, C2, and C3 by a plurality of groove portions 57. Each of the regions C1, C2, and C3 in the metal fiber sheet 50 divided into a plurality of regions serves as a channel for the temperature control medium.

The temperature control unit 6 is equipped with a first metal layer 56, a second metal layer 52, and a means for introducing a temperature control medium (not shown), and for this reason, the temperature of the metal fiber sheet 50 can be effectively changed by introducing the temperature control medium into the voids of the respective regions C1, C2, and C3 of the metal fiber sheet 50. The channels of the regions C1, C2, and C3 may be completely blocked, or the channels may be narrowed by the groove portion 57.

The temperature control unit 6 can be manufactured, for example, by pressurizing the surface of the first metal layer 51 on the upper surface of the temperature control unit 5 (base material) mentioned above to form one or more groove portions 57 in an arbitrary shape.

When the groove portion 57 is formed, an external force is applied to the surface of the first metal layer 51 on the upper surface of the temperature control unit 5, and thereby, the first metal layer 51, the metal fiber sheet 50, and the second metal layer 52 may be fixed and joined in this order. As a method of applying an external force to the surface of the first metal layer 51, pressure may be applied or driving may be performed, and any molding method can be applied. A laser may be used for bonding, or a resin, vitrified bond, or the like may be used.

The temperature control unit 5 may be cut into a desired size before forming the groove portion 57, and the groove portion 57 may be formed after adjusting the size.

Effects of Sixth Embodiment

The metal fiber sheet 50 among the regions C1, C2, and C3 is bound, and for this reason, the number of voids is relatively reduced in the bound portion of the metal fiber sheet 50, and the size of the void is also reduced. For this reason, the temperature control medium introduced into each of the regions C1, C2, and C3 of the metal fiber sheet 50 is less likely to pass through the metal fiber sheet 50 in the portion fixed or narrowed by the groove portion 57. As a result, according to the temperature control unit 6, the temperature change due to the temperature control medium of each of the regions C1, C2, and C3 of the metal fiber sheet 50 is more likely to occur as compared with the temperature control unit 5 described above. In addition, by introducing a temperature control medium into the voids of the regions C1, C2 and C3 of the metal fiber sheet 50, the temperature of each of the regions C1, C2 and C3 of the metal fiber sheet 50 can be topically changed. For this reason, the temperature of the object in contact with the first metal layer 56 or the second metal layer 52 at the portion in contact with each of the regions C1, C2, C3 can be selectively and topically adjusted.

As described above, according to the temperature control unit 6, the temperatures of the first metal layer 56 and the second metal layer 52 at the portions in contact with the respective regions C1, C2, and C3 of the metal fiber sheet 50 can be topically adjusted. For example, the temperature control medium may be introduced into all of the plurality of the regions C1, C2, and C3 at the same time, or the temperature control medium may be selectively introduced into at least one of the plurality of regions C1, C2, and C3.

The position where the groove portion 57 is formed can be changed as appropriate. In addition, by changing the position where the groove portion 57 is formed, the positions of the metal fiber sheet 50, the first metal layer 56, and the second metal layer 52 of which the temperature changes topically can be modified. As described above, one of the features of the temperature control unit 6 is in that a degree of freedom in design is high, and easy application to the surface of objects having various shapes can be carried out.

Seventh Embodiment

Figure 18:
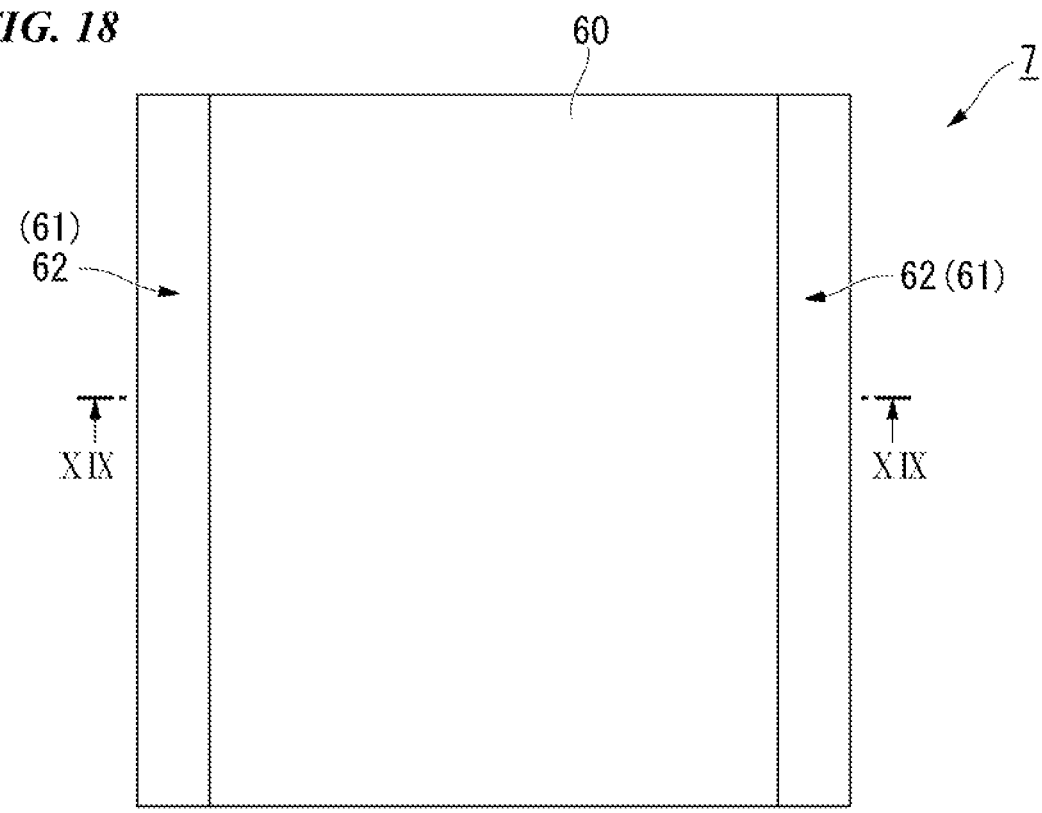
FIG. 18 is a top view which shows a temperature control unit of a 7$^{th}$ Embodiment.
Figure 19:
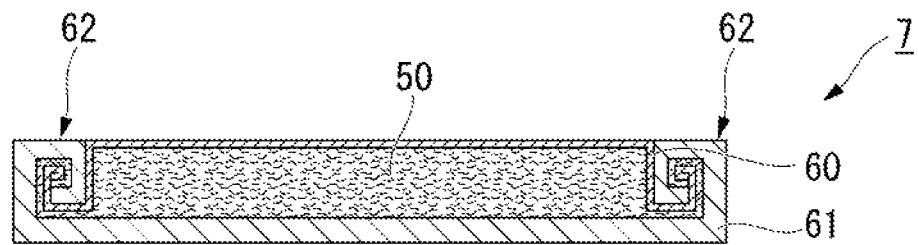
FIG. 19 is a sectional view taken along line XIX-XIX of the temperature control unit of FIG. 18.
Figure 20:
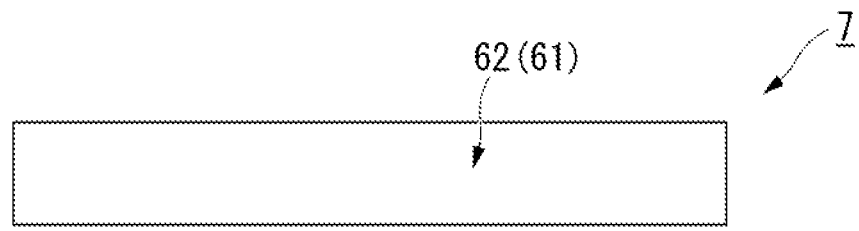
FIG. 20 is a side view of the temperature control unit of FIG. 18.

FIG. 18 is a top view showing a temperature control unit of a seventh embodiment. FIG. 19 is a sectional view taken along line XIX-XIX of the temperature control unit of FIG. 18. FIG. 20 is a side view of the temperature control unit of FIG. 18.

The temperature control unit 7 of the seventh embodiment is equipped with a metal fiber sheet 50 and a temperature control medium (not shown), and is further equipped with a first metal layer 60, a second metal layer 61, and a means for introducing the temperature control medium, which is not shown.

As shown in FIG. 18 and FIG. 19, the temperature control unit 7 has fixing portions 62 at both ends. In the fixing portion 62, the first metal layer 60, the metal fiber sheet 50, and the second metal layer 61 are fixed.

In the temperature control unit 7, the fixing portion 62 is formed so that the first metal layer 60, the metal fiber sheet 50, and the second metal layer 61 are wound in this order and folded. The portion of the metal fiber sheet 50 separated by the fixing portions 62 at both ends functions as a channel for the temperature control medium.

The temperature control unit 7 includes the first metal layer 60, the second metal layer 61, and the means for introducing a temperature control medium (not shown), and for this reason, by introducing a temperature control medium into the voids of a portion of the metal fiber sheet 50 separated by the fixing portions 62 at both ends, the temperature of the metal fiber sheet 50 can be efficiently changed.

The temperature control unit 7 can be manufactured, for example, by forming the fixing portions 62 at both ends of the temperature control unit 5 (base material) described above. When the fixing portion 62 is formed, the first metal layer 56, the metal fiber sheet 50, and the second metal layer 52 at both ends of the temperature control unit 5 are integrally wound to the inside from the end portion and folded. Thereby, the end portions may be fixed. As described above, the fixing portions 62 can be formed by crimping both ends of the temperature control unit 5.

The temperature control unit 5 may be cut into a desired size to adjust the size before forming the fixing portion 62, and thereby, the fixing portion 62 may be formed. The method for forming the fixing portion is not limited to the above one, and the fixing portion may be formed by adhering the first metal layer 60 and the second metal layer 61, and the fixing portion may be formed by fusion using a laser or the like.

Effects of Seventh Embodiment

The temperature control unit 7 has the fixing portions 62, and the side surface of the temperature control unit 7 is blocked by the fixing portion 62. For this reason, it is difficult to derive the temperature control medium from the side surface of the temperature control unit 7. Therefore, as compared with the temperature control unit 5, the temperature change of the metal fiber sheet 50 due to the temperature control medium is more likely to occur, and the temperature control efficiency of the temperature control unit 7 is further increased.

Eighth Embodiment

Figure 21:
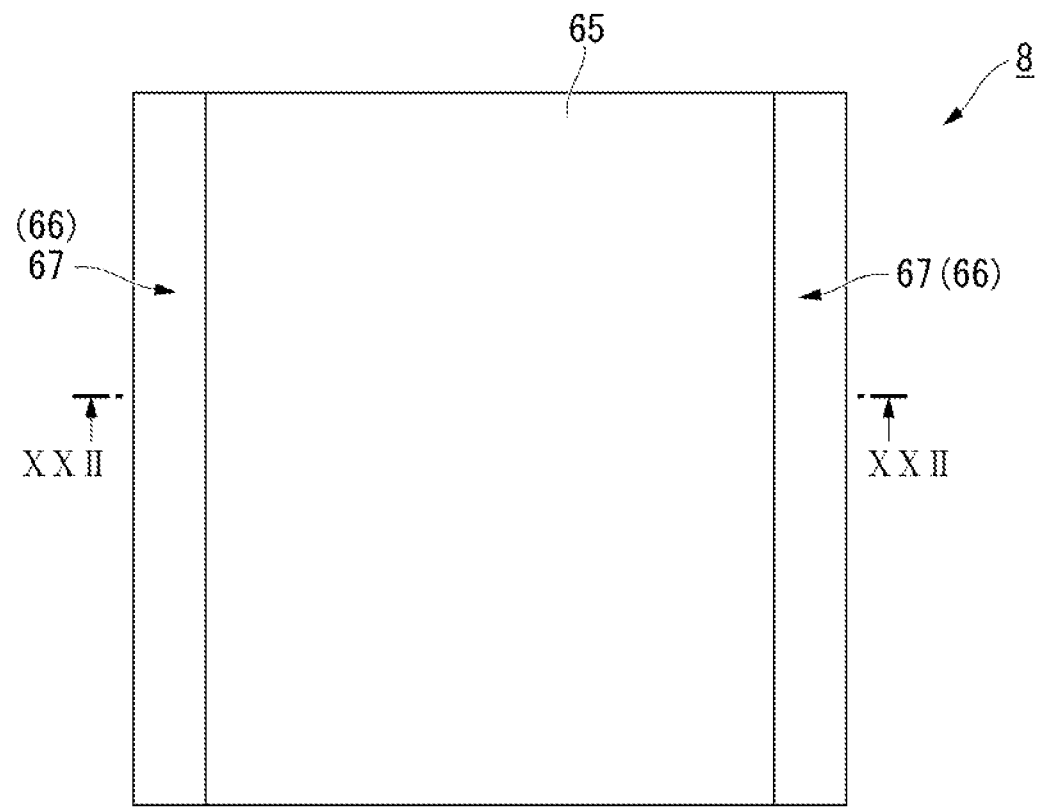
FIG. 21 is a top view which shows a temperature control unit of a 8$^{th}$ Embodiment.
Figure 22:
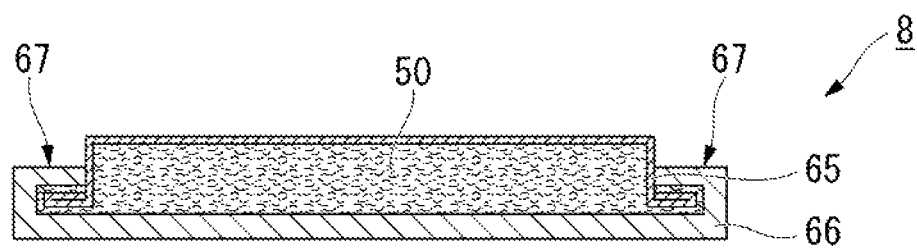
FIG. 22 is a sectional view taken along line XXII-XXII of the temperature control unit of FIG. 21.
Figure 23:
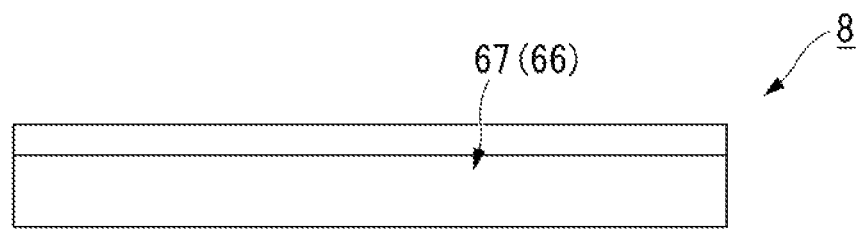
FIG. 23 is a side view of the temperature control unit of FIG. 21.

FIG. 21 is a top view showing a temperature control unit of an eighth embodiment. FIG. 22 is a sectional view taken along line XXII-XXII of the temperature control unit of FIG. 21. FIG. 23 is a side view of the temperature control unit of FIG. 21.

The temperature control unit 8 of the eighth embodiment is equipped with a first metal layer 65, a second metal layer 66, and a temperature control medium, which is not shown, in addition to a metal fiber sheet 50 and a temperature control medium (not shown). In addition, the temperature control unit 8 has crimping portions 67 at both ends. In the crimping portion 67, the first metal layer 65, the metal fiber sheet 50, and the second metal layer 66 are integrally crimped and fixed.

In the temperature control unit 8, the first metal layer 65, the metal fiber sheet 50, and the second metal layer 66 are wound and folded in this order. In addition, they are fixed in the folded state. Thereby, the crimping portion 67 is formed. In the temperature control unit 8, the metal fiber sheet 50 at the portion separated by the crimping portions 67 at both ends serves as a channel for the temperature control medium.

The temperature control unit 8 has the first metal layer 65, the second metal layer 66, and a means for introducing a temperature control medium, which is not shown, and for this reason, by introducing a temperature control medium into the voids of the portion of the metal fiber sheet 50 separated by crimping portions 67 at both ends thereof, the temperature of the metal fiber sheet 50 can be changed efficiently.

The temperature control unit 8 can be manufactured, for example, by forming crimping portions 67 at both ends of the temperature control unit 5 (base material) described above. When the crimping portion 67 is formed, at first, the first metal layer 51, the metal fiber sheet 50, and the second metal layer 52 at both ends of the temperature control unit 5 are integrally wound together from the end to the inside, and folded. Next, the first metal layer 51, the metal fiber sheet 50, and the second metal layer 52, which are overlapped by folding, are crushed integrally and crimped. As described above, the crimping portion 67 may be formed by crimping after crimping both ends of the temperature control unit 5. In addition, the joint may be formed by heating and fusing at the time of crimping.

The temperature control unit 5 may be cut into a desired size before forming the crimping portion 67, and after adjusting the size, the crimping portion 67 may be formed.

Effects of Eighth Embodiment

In the temperature control unit 8, the side surfaces of the temperature control unit 8 are closed surfaces by the crimping portions 67 at both ends of the metal fiber sheet 50, and for this reason, it becomes difficult to derive the temperature control medium from the side surface of the temperature control unit 8. Therefore, as compared with the temperature control unit 5, the temperature change of the metal fiber sheet 50 due to the temperature control medium is more likely to occur, and the temperature control efficiency of the temperature control unit 8 is further improved.

Ninth Embodiment

Figure 24:
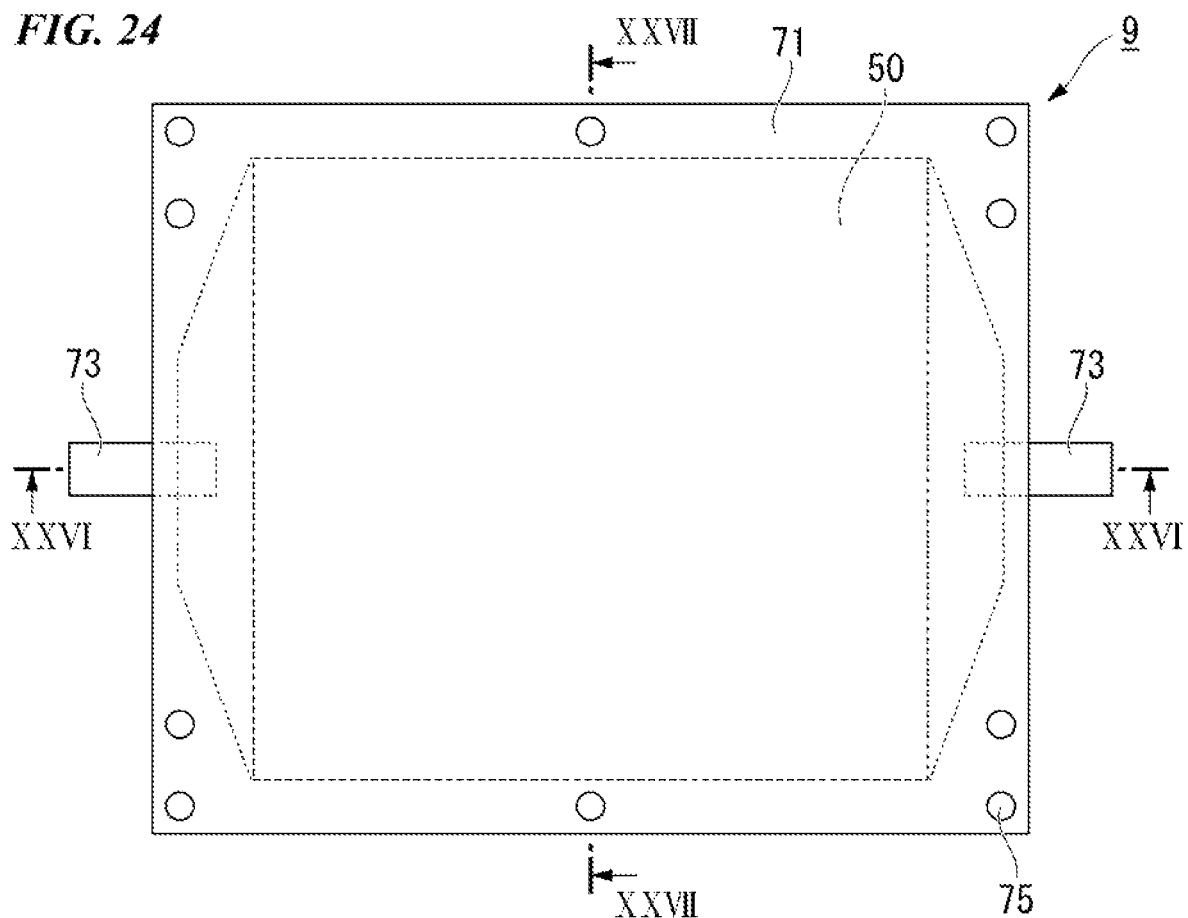
FIG. 24 is atop view which shows a temperature control unit of a 9$^{th}$ Embodiment.
Figure 25:
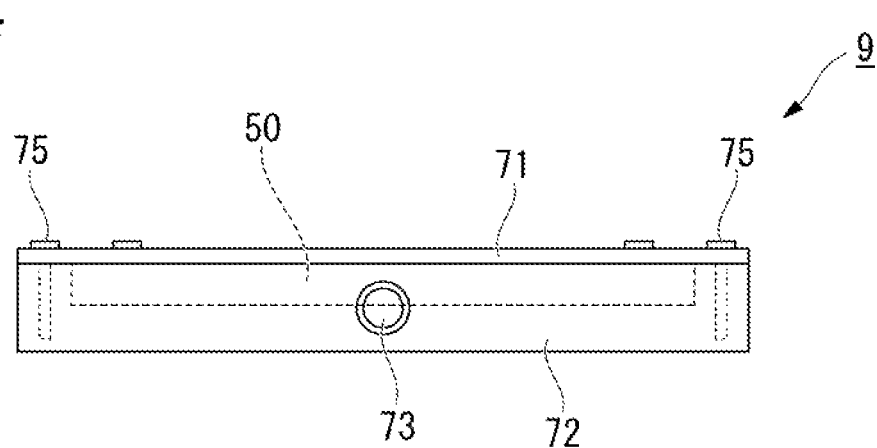
FIG. 25 is a side view of the temperature control unit of FIG. 24.
Figure 26:
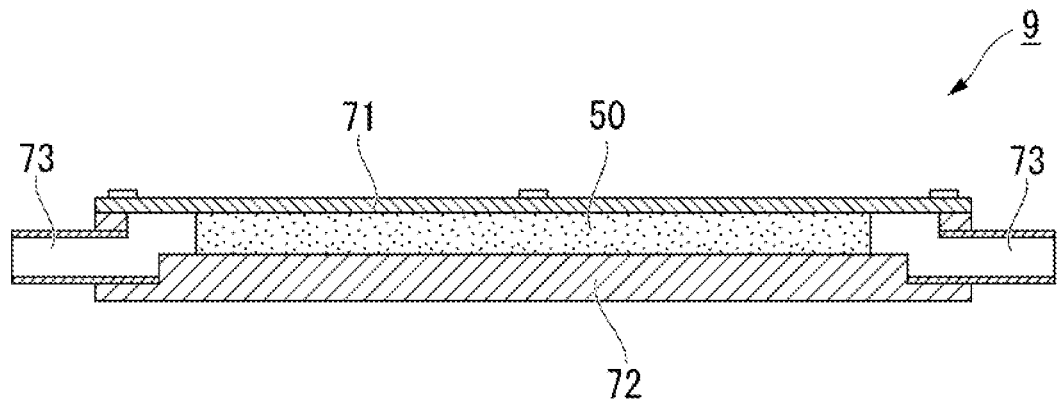
FIG. 26 is a sectional view taken along line XXVI-XXVI of the temperature control unit of FIG. 24.
Figure 27:
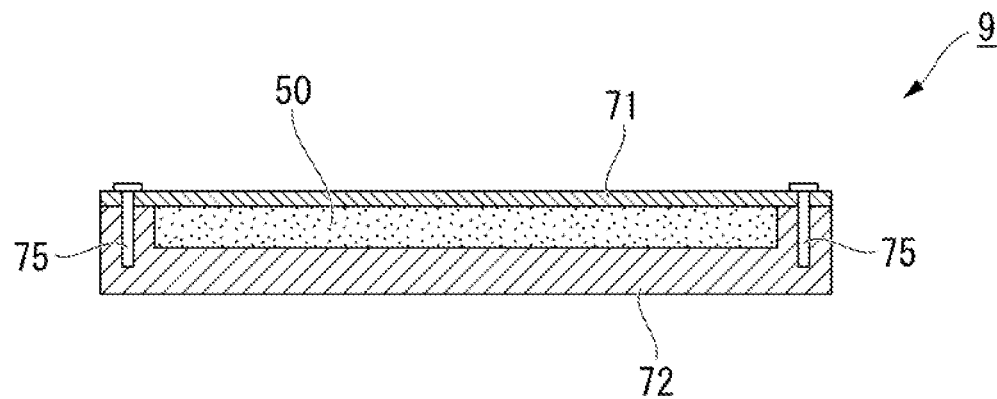
FIG. 27 is sectional view taken along line XXVII-XXVII of the temperature control unit of FIG. 24.

FIG. 24 is a top view showing a temperature control unit of the ninth embodiment. FIG. 25 is a side view of the temperature control unit of FIG. 24. FIG. 26 is a sectional view taken along line XXVI-XXVI of the temperature control unit of FIG. 24. FIG. 27 is a cross-sectional view of the temperature control unit of FIG. 24 taken along line XXVII-XXVII. The dotted lines shown in FIGS. 24 and 25 schematically show the metal fiber sheet 50 arranged under the first metal layer 71.

A temperature control unit 9 of the ninth embodiment includes a metal fiber sheet 50 and a temperature control medium (not shown), and further includes a first metal layer 71, a second metal layer 72, a port portion 73, a stopper 75, and a means for introducing a temperature control medium (not shown). The first metal layer 71 is provided on the upper side of the metal fiber sheet 50. As shown in FIGS. 25 to 27, the second metal layer 72 is provided on the lower side of the metal fiber sheet 50. In addition, the side surface of the temperature control unit 9 is covered with a second metal layer 72. That is, the second metal layer 72 has a rectangular dish-like shape. A port portion 73 is formed on the side surface of the temperature control unit 9 covered with the second metal layer 72.

The port portion 73 is an introduction port for introducing the temperature control medium into the temperature control unit 9 or a take-out port for leading out the temperature control medium from the inside of the temperature control unit 9.

The stopper 75 is a member for fixing the first metal layer 71 and the second metal layer 72 in a state where the metal fiber sheet 50 is sandwiched between the first metal layer 71 and the second metal layer 72, or in a state where the metal fiber sheet 50 is not sandwiched between these.

Effects of Ninth Embodiment

In the temperature control unit 9, the temperature control medium can be introduced into the voids of the metal fiber sheet 50 by introducing the temperature control medium from the opening surface of the port portion 73. Therefore, a hose or the like may be provided on the opening surface of the port portion 73 to introduce a temperature control medium.

The temperature control unit 9 has the port portion 73, and for this reason, the temperature control medium can be easily and effectively introduced into the voids of the metal fiber sheet 50.

When a plurality of temperature control units 9 are used, if the port portions 73 of the plurality of temperature control units 9 are connected to each other by a hose or the like, any form of temperature control unit can be provided, and a degree of freedom in design is enhanced. For this reason, according to the temperature control unit 9, it is easy to apply to the surfaces of the objects having various shapes.

Tenth Embodiment

Figure 28:
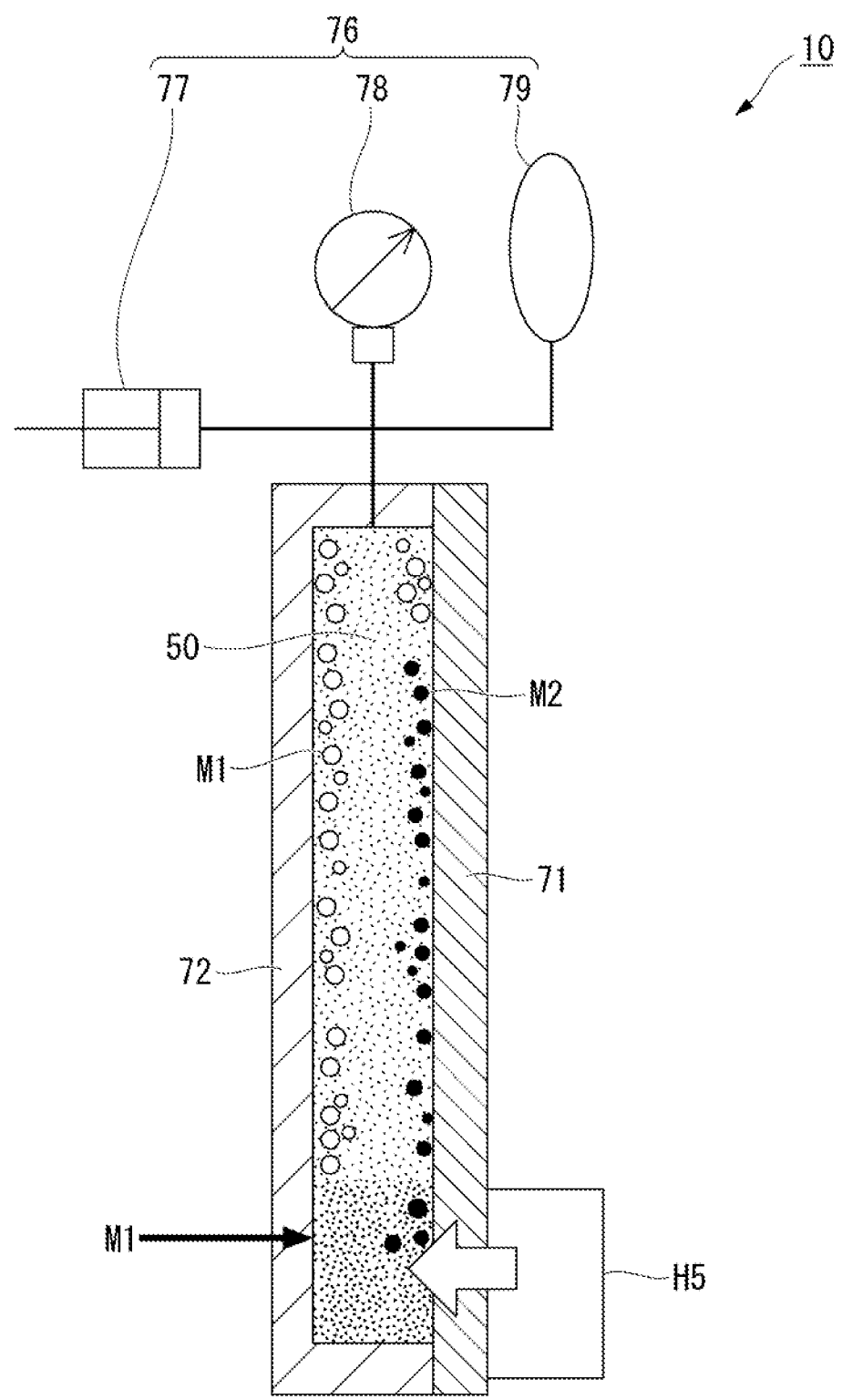
FIG. 28 is a schematic view which shows a temperature control unit of a 10$^{th}$ Embodiment.

FIG. 28 is a schematic view showing the configuration of a temperature control unit of the tenth embodiment.

The temperature control unit 10 of the tenth embodiment includes a first metal layer 71, a second metal layer 72, and a decompression portion 76 in addition to a metal fiber sheet 50 and a temperature control media M1 and M2. The temperature control unit 10 may further include a means for introducing the temperature control medium. The temperature control unit 10 adjusts the temperature of a heating element H5 by coming into contact with the heating element H5.

The decompression portion 76 has a syringe 77, a pressure gauge 78, and an elastic balloon 79.

The syringe 77 is connected to the inside of the temperature control unit 10. As a result, the decompression portion 76 decompresses the voids inside the metal fiber sheet 50.

The pressure gauge 78 measures and displays the pressure inside the metal fiber sheet 50. The elastic balloon 79 is not particularly limited as long as it has a mode such that the volume changes according to the pressure change inside the temperature control unit 10 by the syringe 77.

In the temperature control unit 10, a temperature control medium M1 in a liquid state exists below the internal space in which the metal fiber sheet 50 is arranged. The temperature control medium M2 in a gaseous state exists above the internal space in which the metal fiber sheet 50 is arranged. The temperature control medium M2 is an evaporated one of the temperature control medium M1.

In the temperature control unit 10, the temperature of the temperature control medium M1 rises due to heat exchange with the heating element H5 and evaporates to become the temperature control medium M2. When the state of the temperature control medium M1 changes, the temperature control medium M1 moves from the lower part to the upper part of the void in the metal fiber sheet 50 in the temperature control unit 10. The temperature control medium M2 moved to the upper part of the temperature control unit 10 is cooled in the process of contacting with the metal fiber sheet 50, a first metal layer 71, and a second metal layer 72, existing in the upper part of the temperature control unit 10 whose temperature is relatively lower than that in the lower part of the temperature control unit 10. As a result, the temperature of the temperature control medium M2 drops to liquefy and return to the temperature control medium M1, and moves to the lower part of the temperature control unit 10. As described above, in the temperature control unit 10, the temperature control medium can repeatedly rise and fall in the voids in the metal fiber sheet 50 while repeating liquefaction and evaporation. That is, the voids in the metal fiber sheet 50 function as a space that serves as a channel through which the temperature control medium circulates and flows.

In addition, the temperature control unit 10 includes the decompression portion 76, and for this reason, it is possible to control the boiling point of the temperature control medium and the like, so that the liquefaction and evaporation of the temperature control medium can be controlled. As a result, the latent heat of liquefaction and the latent heat of evaporation can be effectively utilized, so that the temperature of the heating element H5 can be easily adjusted to an arbitrary temperature.

In the temperature control unit 10, at least a part of the temperature control medium M1 in the liquid state at the lower part of the internal space in which the metal fiber sheet 50 is arranged may be in the solid state.

When at least a part of the temperature control medium is present in the solid state, the temperature control medium absorbs heat from the heating element H5 via the metal fiber sheet 50, the temperature of the temperature control medium in the solid state rises, and the temperature of the heating element H5 drops. While the temperature of the temperature control medium in the solid state is rising, the heat transferred from the heating element H5 to the temperature control unit 10 is used as sensible heat.

Subsequently, when the temperature of the temperature control medium rises to near the melting point, the heat transferred from the heating element H5 to the temperature control unit 10 is used as melting latent heat when the temperature control medium changes the state from a solid state to a liquid state.

As described above, when at least a part of the temperature control medium exists in the solid state, the latent heat at the time of changing from the solid state to the liquid state can be effectively used, so that the temperature of the heating element H5 can be adjusted more efficiently.

Effects of Tenth Embodiment

When the heat of the heating element H5 is transmitted to the temperature control medium M1 via the first metal layer 71, the temperature of the temperature control medium M1 rises, and the temperature of the temperature control medium M1 eventually reaches the boiling point. Here, when the pressure is reduced by the decompression portion 76, the boiling point of the temperature control medium M1 is relatively lowered. For this reason, the state of the temperature control medium M1 easily changes from a liquid state to a gaseous state. As a result, it is possible to adjust the temperature at which the effect of latent heat can be maximized when the state of the temperature control medium M1 changes from a liquid to a gas.

Therefore, the temperature control unit 10 has the decompression portion 76 that reduces the pressure inside the voids inside the metal fiber sheet 50, and for this reason, the temperature control medium can be evaporated at a temperature lower than a usual temperature. Therefore, the temperature at which the effect of latent heat can be maximized when the state of the temperature control medium changes from a liquid to a gas can be adjusted, and for this reason, a degree of freedom in temperature control is further enhanced.

Temperature Control Device

Figure 29:
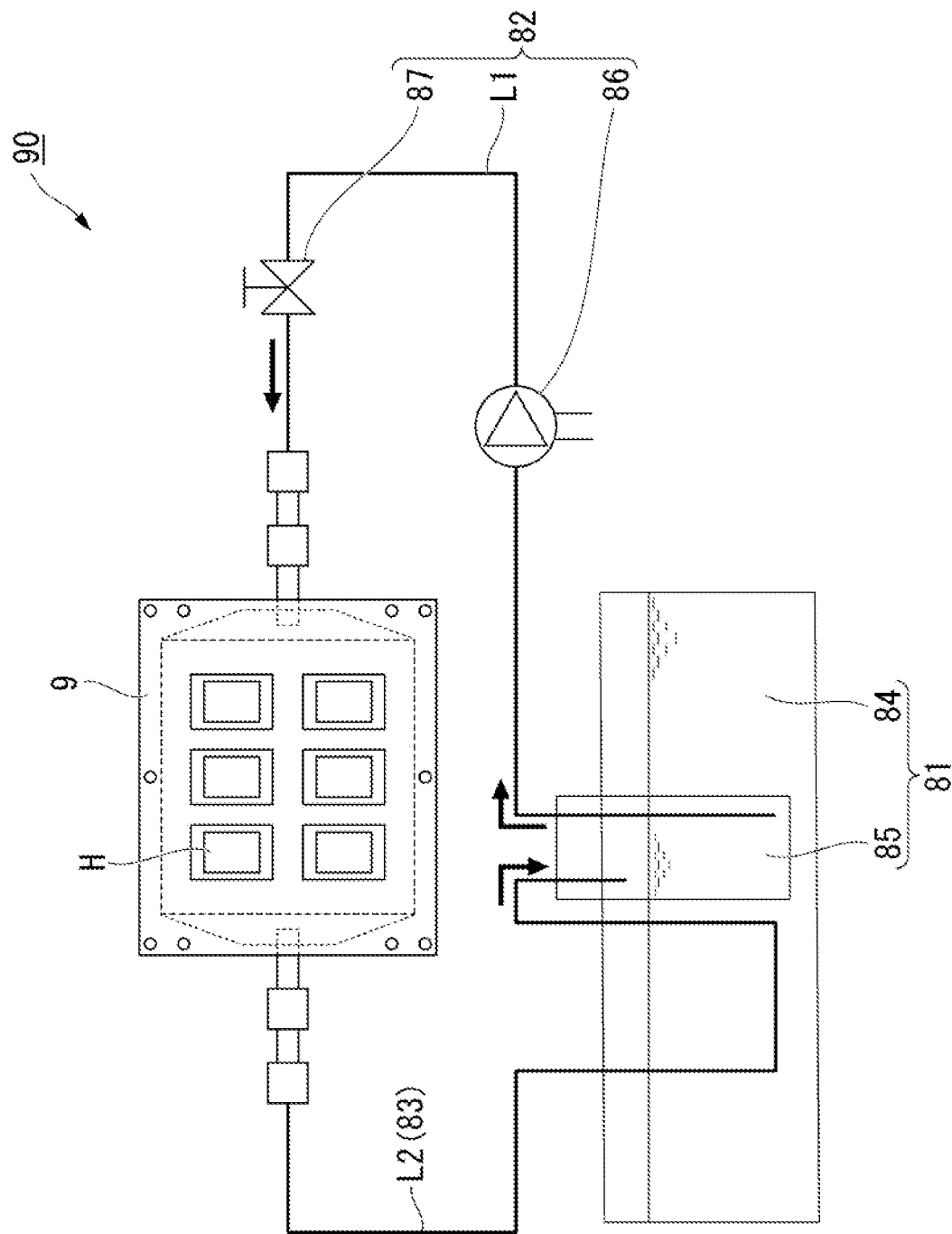
FIG. 29 is a schematic diagram which shows a structure of a temperature control device of one embodiment.

FIG. 29 is a schematic view showing the configuration of a temperature control device of one embodiment.

As shown in FIG. 29, the temperature control device 90 includes a temperature control unit 9, a storage unit 81, a supply unit 82, and a recovery unit 83.

A plurality of heating elements H are arranged on the upper surface of the temperature control unit 9. In this way, the temperature control device 90 adjusts the temperature of the plurality of heating elements H to a low level by bringing a plurality of heating elements into contact with the temperature control unit 9.

In the temperature control device 90, the storage unit 81 has a constant temperature tank 84 and a storage tank 85. The storage tank 85 stores the temperature control medium in a liquid state. The constant temperature tank 84 accommodates the storage tank 85. Thereby, the temperature of the storage tank 85 and the temperature of the temperature control medium can be kept constant.

The storage unit 81 having the configuration described above can keep at least a part of the temperature control medium in a liquid state even when the melting point of the temperature control medium is room temperature or higher.

The supply unit 82 has a supply path L1, a pump 86, and a flow rate control valve 87.

The first end of the supply path L1 is connected to the storage tank 85, and the second end thereof is connected to the primary end of the temperature control unit 9. The pump 86 and the flow rate control valve 87 are provided on the supply path L1 in this order.

The supply unit 82 supplies the temperature control medium from the storage unit 81 to the temperature control unit 9 through the supply path L1, and supplies the temperature control medium to the voids of the metal fiber sheet inside the temperature control unit 9. The supply unit 82 discharges the temperature control medium in the storage tank 85 toward the temperature control unit 9 by the pump 86, and adjusts the flow rate of the temperature control medium by the flow rate control valve 87, so that the temperature control medium can be supplied to the temperature control unit 9.

The recovery unit 83 has a recovery path L2. The recovery path L2 recovers the temperature control medium from the voids of the metal fiber sheet inside the temperature control unit 9 to the storage unit 81.

The first end of the recovery path L2 is connected to the secondary end of the temperature control unit 9, and the second end of the recovery path L2 is connected to the storage tank 85. A part of the recovery path L2 is immersed in the constant temperature bath 84 in front of the storage tank 85. Thereby, it can be easy to lower the temperature of the temperature control medium in the evaporated state, which is recovered from the temperature control unit 9, and keep the temperature control medium in a liquid state.

Effects

In the temperature control device 90 described above, the temperature control medium supplied in a liquid state is introduced into the voids of the metal fiber sheet in the temperature control unit 9. The temperature control medium introduced into the voids acts on the metal fiber sheet or the like to change the temperature thereof. At this time, the state of at least a part of the temperature control medium supplied in the liquid state changes to the gaseous state, and heat absorption due to evaporation occurs. While utilizing this heat absorption, the temperature of the heating element can be effectively lowered.

Subsequently, the temperature control medium in the gaseous state recovered from the temperature control unit is recovered in the storage unit 81 via the recovery path L2, is condensed by the constant temperature tank 84 to change to the liquid state, and is stored in the storage tank 85.

As described above, according to the temperature control device 90, the temperature of the metal fiber sheet of the temperature control unit can be continuously changed while repeatedly evaporating and liquefying the temperature control medium. Therefore, by adjusting the supply amount of the temperature control medium, the temperature change amount of the metal fiber sheet can be adjusted and the temperature of the heating element can be controlled.

Other Embodiments

Figure 30:
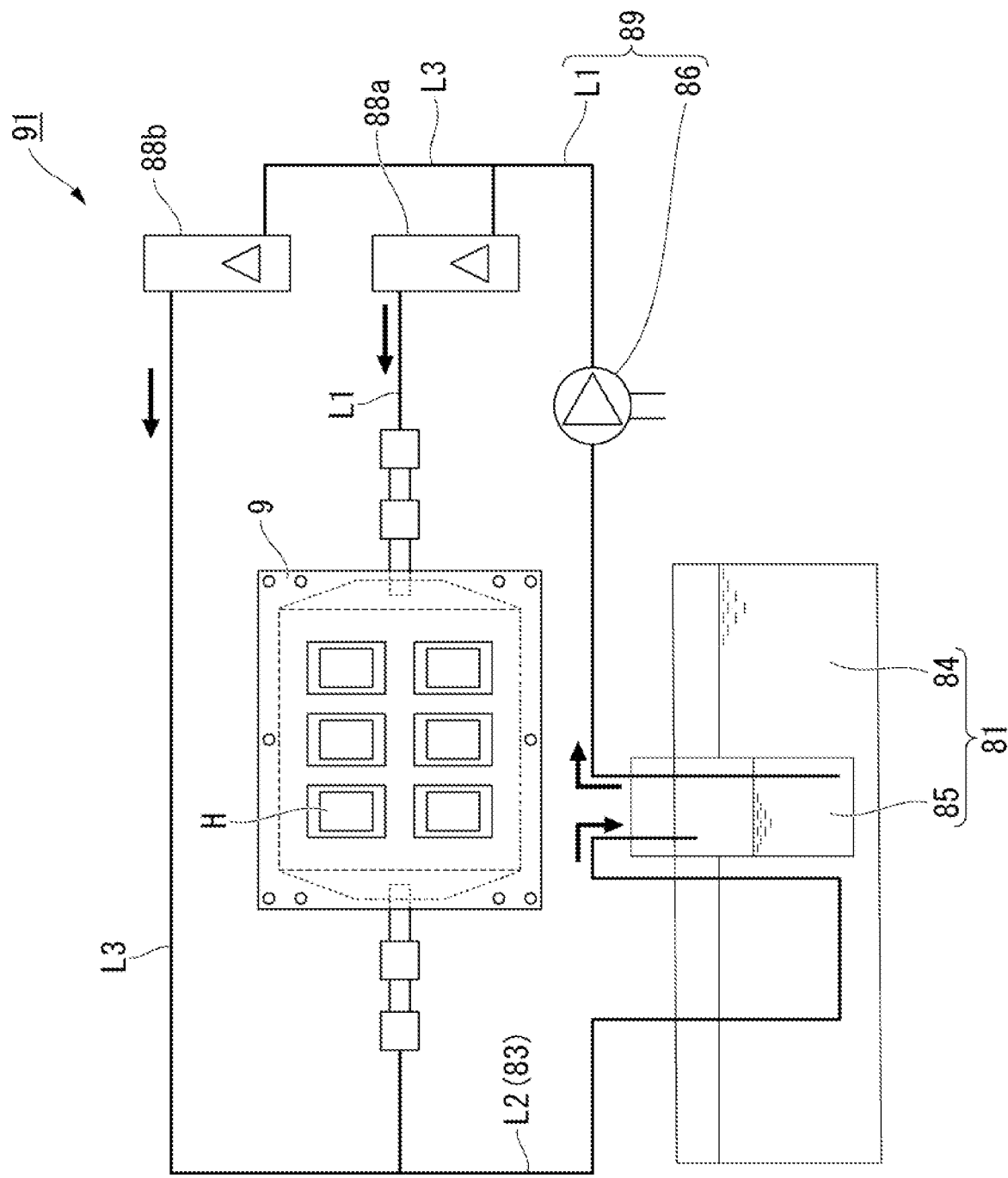
FIG. 30 is a schematic diagram which shows a structure of a temperature control device of another embodiment.

FIG. 30 is a schematic view showing the configuration of a temperature control device 91 according to the other embodiment. The temperature control device 91 includes a temperature control unit 9, a storage unit 81, a supply unit 89, a recovery unit 83, a bypass path L3, and flow meters 88a and 88b. The flow meter 88a is provided in the supply path L1, and the flow meter 88b is provided in the bypass path L3.

The bypass path L3 connects the supply unit 89 and the recovery unit 83. Specifically, the first end of the bypass path L3 is connected to the supply path L1, and the second end of the bypass path L3 is connected to the recovery path L2.

As described above, the temperature control device 91 has the bypass path L3 in addition to the supply path L1, and for this reason, a part of the total amount of the temperature control medium led out from the storage unit 81 can be supplied to the temperature control unit 9, and the rest thereof can be returned to the storage unit 81 as it is. Therefore, the supply amount of the temperature control medium actually supplied from the storage unit 81 to the temperature control unit 9 can be controlled more finely. As a result, the amount of temperature change of the metal fiber sheet in the temperature control unit 9 can be controlled more finely, so that the temperature adjustment of the heating element can be controlled more precisely.

Figure 31:
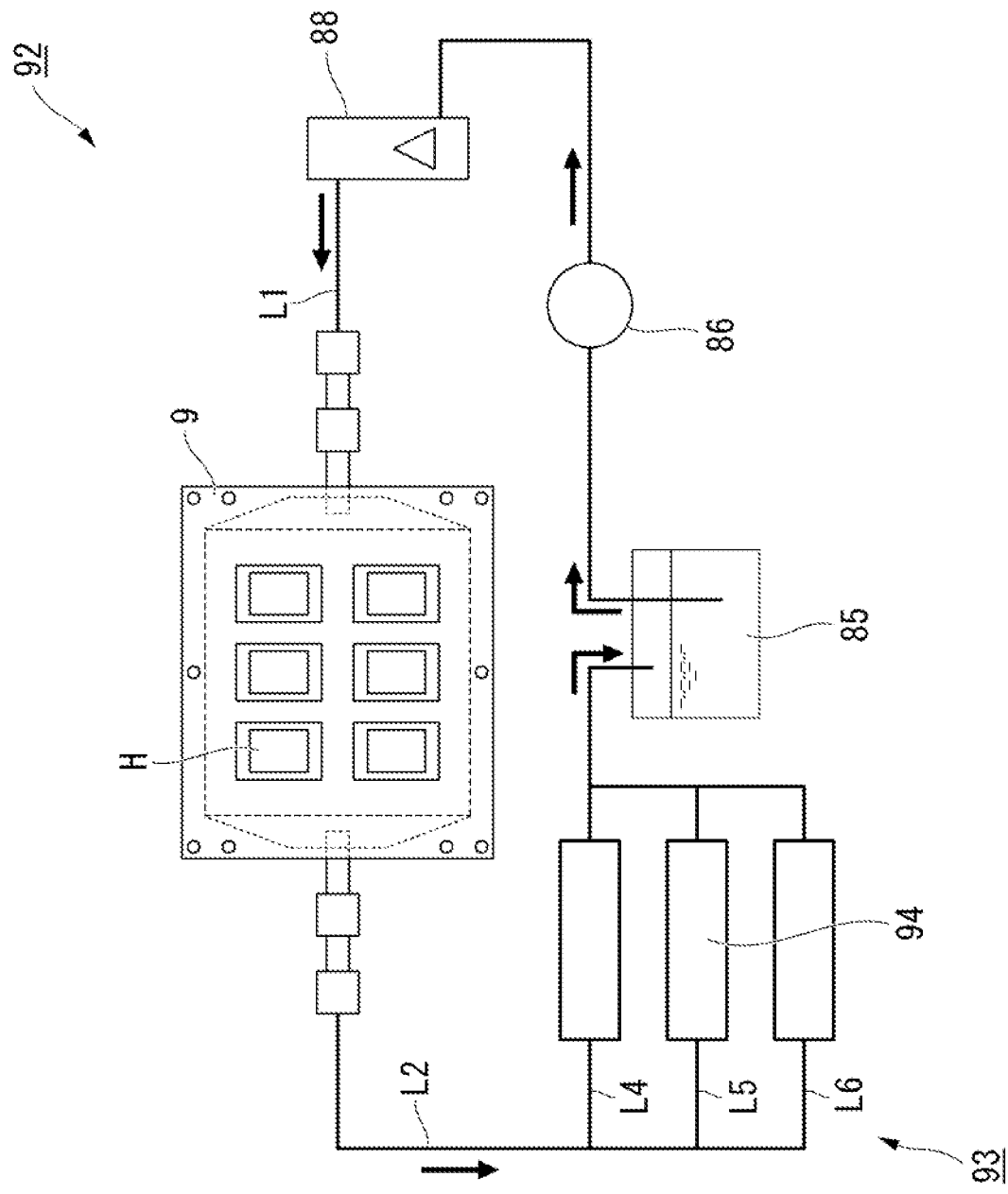
FIG. 31 is a schematic diagram which shows a structure of a temperature control device of another embodiment.

FIG. 31 is a schematic view showing the configuration of a temperature control device 92 according to another embodiment. The temperature control device 92 includes a temperature control unit 9, a storage tank 85, a pump 86, a recovery unit 93, and a flow meter 88. The recovery unit 93 has branch lines L4, L5, and L6 branched from the recovery path L2, and a plurality of heat storage materials 94 provided in each of the branch lines. As examples of the heat storage material 94, mention may be made of those in which a metal fiber sheet is impregnated with paraffin or the like.

The heat storage material 94 takes heat from the temperature control medium heated by the heating element H and liquefies the temperature control medium. Thereby, the need to provide a constant temperature tank can be eliminated. Alternatively, the heat storage material 94 plays a role of assisting the capacity of the constant temperature tank. Therefore, the temperature control device 92 can efficiently control the temperature of the heating element.

Some embodiments of the present invention have been described above. It should be understood that they are presented as examples and are not intended to limit the scope of the invention. The temperature control units of the embodiments can be implemented in various other forms, and various substitutions and modifications can be carried out without departing from the gist of the invention.

INDUSTRIAL APPLICABILITY

The present invention can be widely applied to devices that require temperature control, such as temperature control usages for power semiconductors, power supplies, DC-DC converters, inverter circuits, substrates such as solar cells, and temperature control usages for industrial machine parts having heating elements.

DESCRIPTION OF SYMBOLS 1 to 10 Temperature control unit
11, 12 Opening end portion 20, 21 Support body
22, 22a, 22b, 27, 28 Hollow portion
23, 29 Partition portion
30 Housing body
24, 24a, 24b, 31 to 37 Through-hole
25 Lid body
26 Opening end portion
40, 42 End surface
41 Introduction port
43 Derivation port
50 Metal fiber sheet
51, 56, 60, 65, 71 First metal layer
52, 61, 66, 72 Second metal layer
57 Groove portion
62 Fixing portion
67 Crimping portion
73 Port portion
75 Stopper
76 Decompression portion
77 Syringe
78 Pressure gauge
79 Elastic balloon
81 Storage unit
82, 89 Supply unit
83, 93 Recovery unit
84 Constant temperature tank
85 Storage tank
86 Pump
87 Flow rate control valve
88 Flow meter
90, 91, 92 Temperature control device
$D_1$, $D_2$ Thickness of metal fiber sheet
H1 to H6 Heating element
L1 Supply path
M1 Temperature control medium in a liquid state
M2 Temperature control medium in a gaseous state
S1 to S6 Mounting portion

What is claimed is:

1. A temperature control device, comprising:
(i) a temperature control unit, which controls a temperature of an object, comprising:
a temperature control medium; and
a metal body in which a space serving as a channel of said temperature control medium is formed,
wherein said temperature control medium has a latent heat of evaporation of said temperature control medium within a range of from 70 to 200 KJ/kg when said temperature control medium changes a state thereof from a liquid to a gas, and said temperature control medium has a coefficient of volume expansion which is at most 250 times when said temperature control medium changes a state thereof from a liquid to a gas under atmospheric pressure, and
wherein at least one part of said temperature control medium exists in said space in a solid state;
(ii) a storage tank configured to store said temperature control medium;
(iii) a supply path configured to supply said temperature control medium from the storage tank to the channel; and
(iv) a recovery path configured to recover said temperature control medium from the channel to the storage tank.

2. The temperature control device according to claim 1, wherein said temperature control medium is at least one selected from the group consisting of hydrofluorocarbons and hydrofluoro ethers.

3. The temperature control device according to claim 1, wherein said temperature control medium is 1,1,2,2,3,3,4-heptafluorocyclopentane.

4. The temperature control device according to claim 1, wherein said metal body is a porous metal body.

5. The temperature control device according to claim 1, wherein said metal body is a metal fiber body.

6. The temperature control device according to claim 5, wherein said metal fiber body is a metal fiber sheet containing copper fibers.

7. The temperature control device according to claim 1, further comprising a housing body for accommodating said metal body.

8. The temperature control device according to claim 7, wherein said housing body is composed of at least one selected from the group consisting of a copper plate, an aluminum plate, a copper foil, and an aluminum foil.

9. The temperature control device according to claim 1, further comprising a support body for supporting said metal body, wherein a hollow portion serving as an external channel for introducing said temperature control medium into said channel is formed in said support body.

10. The temperature control device according to claim 9, wherein a through-hole through which said temperature control medium is led out from said hollow portion toward said metal body is formed in said support body.

11. The temperature control device according to claim 9, further comprising a lid body for covering said metal body.

12. The temperature control device according to claim 6, further comprising a first metal layer provided on an upper side of the metal fiber sheet and a second metal layer provided on a lower side of the metal fiber sheet.

13. The temperature control device according to claim 1, further comprising a decompression portion that depressurizes said space.

14. The temperature control device according to claim 1, further comprising a bypass path connecting said supply unit and said recovery unit.

* * * * *